United States Patent
Sun et al.

(10) Patent No.: US 7,187,216 B2
(45) Date of Patent: Mar. 6, 2007

(54) PHASE SELECTABLE DIVIDER CIRCUIT

(75) Inventors: Lizhong Sun, Nashua, NH (US); Douglas F. Pastorello, Hudson, NH (US); Richard J. Juhn, Nashua, NH (US); Axel Thomsen, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 38 days.

(21) Appl. No.: 10/878,198

(22) Filed: Jun. 28, 2004

(65) Prior Publication Data

US 2005/0242848 A1 Nov. 3, 2005

Related U.S. Application Data

(60) Provisional application No. 60/567,479, filed on May 3, 2004.

(51) Int. Cl.
  *H03K 21/00* (2006.01)
(52) U.S. Cl. .................... 327/115; 327/117
(58) Field of Classification Search .............. None
  See application file for complete search history.

(56) References Cited

U.S. PATENT DOCUMENTS

| | | | |
|---|---|---|---|
| 3,813,610 A | 5/1974 | Kimura | |
| 5,425,074 A | 6/1995 | Wong | |
| 6,061,418 A | 5/2000 | Hassoun | |
| 6,617,893 B1 | 9/2003 | Born et al. | |
| 6,618,462 B1 * | 9/2003 | Ross et al. ............. | 377/48 |
| 6,683,932 B1 * | 1/2004 | Wood ...................... | 377/47 |
| 6,807,552 B2 * | 10/2004 | Bredin et al. ............ | 708/103 |
| 6,930,519 B2 * | 8/2005 | Fallahi et al. ............ | 327/115 |
| 6,952,125 B2 | 10/2005 | Ahn et al. | |
| 6,970,025 B2 | 11/2005 | Magoon et al. | |
| 2005/0212570 A1 | 9/2005 | Sun | |

OTHER PUBLICATIONS

Craninckx, Jan and Steyaert, Michiel S. J., "A 1.75-GHz/3-V Dual-Modulus Divide-by-128/129 Prescaler in 0.7-μm CMOS," IEEE Journal of Solid-State Circuits, vol. 31, No. 7, Jul. 1996, pp. 890-897.

Krishnapura, Nagendra and Kinget, Peter R., "A 5.3-GHz Programmable Divider for HiPerLAN in 0.25- μm CMOS," IEEE Journal of Solid-State Circuits, vol. 35, No. 7, Jul. 2000, pp. 1019-1024.

Perrott, Michael Henderson, "Techniques for High Data Rate Modulation and Low Power Operation of Fractional-N Frequency Synthesizers," Dissertation, Massachusetts Institute of Technology, Sep. 1997, pp. 1-199.

* cited by examiner

*Primary Examiner*—Timothy P. Callahan
*Assistant Examiner*—Cassandra Cox
(74) *Attorney, Agent, or Firm*—Zagorin O'Brien Graham LLP

(57) ABSTRACT

A phase selectable divider circuit includes a select circuit receiving a plurality of signals having a common frequency and a different phase. One of the plurality of signals, having a first phase, is selected as a selector circuit output signal. A first value corresponding to the first phase is summed with a second value corresponding to a phase offset from the first phase to generate a sum indicative thereof. That sum is used to select a second one of the signals having a second phase as the next selector circuit output signal. As successive sums are generated, a pulse train is supplied by selector circuit having a desired frequency.

51 Claims, 23 Drawing Sheets

| divSel | R (mod 8) | R' (effective R) | Division Factor |
|---|---|---|---|
| - | 1 | 1 | 0.5 |
| - | 2 | 2 | 1.0 |
| - | 3 | 3 | 1.5 |
| 0 | 4 | 4 | 2.0 |
| 1 | 5 | 5 | 2.5 |
| 2 | 6 | 6 | 3.0 |
| 3 | 7 | 7 | 3.5 |
| 4 | 0 | 8 | 4.0 |
| 5 | 1 | 9 | 4.5 |
| 6 | 2 | 10 | 5.0 |
| 7 | 3 | 11 | 5.5 |

| M' | Q | R | output freq |
|----|---|----|-------------|
| 5  | 1 | −3 | 500M |
| 6  | 1 | −2 | 416M |
| 7  | 1 | −1 | 357M |
| 8  | 1 | 0  | 312M |
| 9  | 1 | 1  | ⋮ |
| 10 | 1 | 2  | |
| 11 | 1 | 3  | |
| 12 | 1 | 4  | |
| 13 | 2 | −3 | |
| 14 | 2 | −2 | |
| 15 | 2 | −1 | |
| 16 | 2 | 0  | |
| ⋮  | ⋮ | ⋮  | |
| 287 | 36 | −1 | 8.71M |
M'=8Q+R
FIG. 16
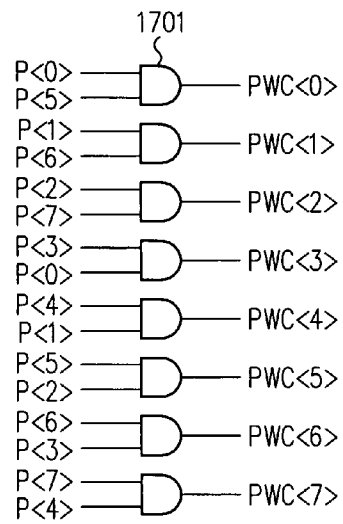
FIG. 17C
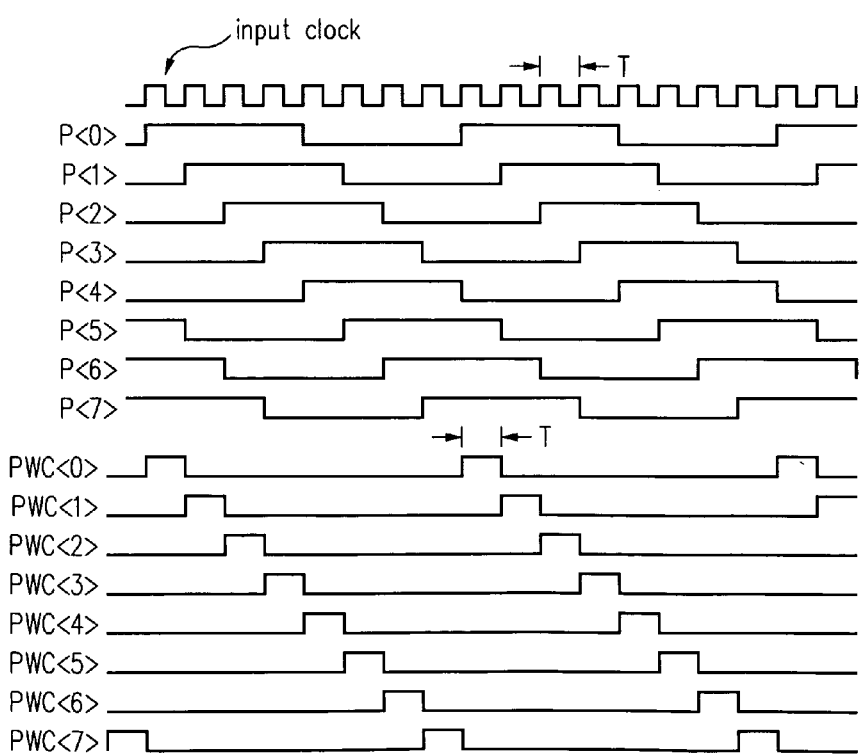
FIG. 17A
FIG. 17B

PHASE SELECTABLE DIVIDER CIRCUIT

CROSS-REFERENCE TO RELATED APPLICATION(S)

This application claims benefit to a provisional application 60/567,479, under 35 U.S.C. § 119(e), naming Axel Thomsen et al., as inventors, entitled "METHOD AND APPARATUS FOR A PROGRAMMABLE CLOCK SOURCE GENERATING A WIDE RANGE OF OUTPUT FREQUENCIES", filed May 3, 2004.

BACKGROUND

1. Field of the Invention

This application relates to divider circuits and more particularly to programmable divider circuits useful for dividing high speed signals.

2. Description of the Related Art

Many applications use divider circuits to divide high speed clock signals. In order to provide flexibility, programmable divider circuits may be preferred in some applications. Several approaches for such programmable divider circuits are known in the art. For example, FIG. 1 illustrates a programmable divider based on a conventional dual modulus prescalar. The output frequency $$f_{out} = \frac{f_{in}}{R(P+1)+(Q-R)P} = \frac{f_{in}}{QP+R}.$$

Several aspects of the divider circuit illustrated in FIG. 1 may make it undesirable for certain applications. For example, the feedback loop around P/(P+1) limits the maximum possible speed of the divider circuit and thus the speed of the signals that can be divided. Additionally, the clock input will be loaded by $(\log_2 P+1)$ flip flops. Also, synchronization circuitry is required to change the modulus and reset the counters correctly.

Another prior art approach is illustrated in FIG. 2, which shows a programmable divider based on a loadable backward counter. The circuit includes a loadable backward counter 201 with a zero detect circuit 203. The feedback loop formed by the first-stage SR counter, the zero detector, the load signal (with high fanout) may limit the maximum possible speed of the divider circuit in certain applications.

Accordingly, there is a need for an improved programmable divide circuit.

SUMMARY

Accordingly, according to an embodiment of the invention, a method is provided for dividing a first signal having a first frequency. The method includes supplying a plurality of signals to a selector circuit, the signals having a common frequency and a different phase, the common frequency being lower than the first frequency. A first of the supplied signals, having a first phase, is selected as a selector circuit output signal. A first value, corresponding to the first phase, is summed with a second value corresponding to a phase offset from the first phase and a sum is generated indicative thereof. A second one of the supplied signals having a second phase is selected as the selector circuit output signal according to the sum, to generate a waveform having a frequency lower than the first frequency.

In another embodiment an apparatus is provided for dividing a first signal to generate a lower speed signal. The apparatus includes a selector circuit coupled to receive a plurality of signals having a common frequency and a different phase and to supply one of the received signals as a currently selected signal according to a select signal. The apparatus further includes a summing circuit coupled to add at least a first value corresponding to the select signal and a second value corresponding to a phase offset from a phase of the currently selected signal, and to generate a sum indicative thereof that corresponds to a next value of the select signal.

BRIEF DESCRIPTION OF THE DRAWINGS

The present invention may be better understood, and its numerous objects, features, and advantages made apparent to those skilled in the art by referencing the accompanying drawings.

FIG. 6 describes R values and divide by values that may be associated with the phase selectable divider circuit of FIG. 4.

FIG. 16 illustrates values of Q and R for various values of M and associated output frequencies according to an embodiment of the invention.

FIG. 17A illustrates timing diagram associated with generation of signals having different phases.

FIG. 17B illustrates generation of signals having a particular pulse width being supplied to a phase switching multiplexer circuit according to an embodiment of the invention.

FIG. 17C illustrates a circuit useful to generate the signals in FIG. 17B from the signals in FIG. 17A.

The use of the same reference symbols in different drawings indicates similar or identical items.

DESCRIPTION OF THE PREFERRED EMBODIMENT(S)

Figure 1:
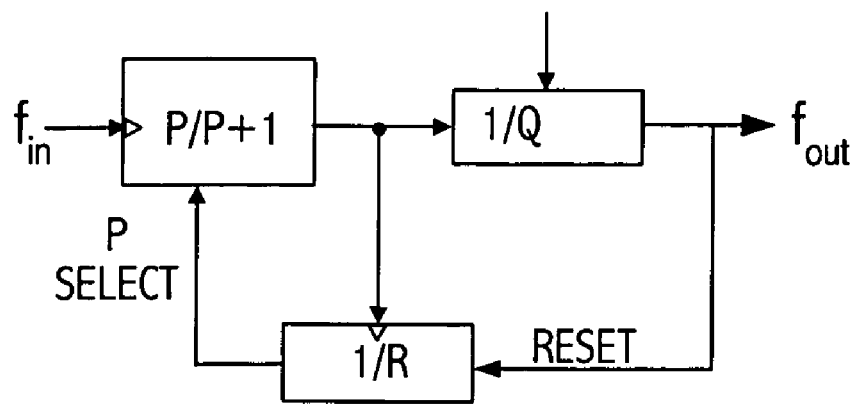
FIG. 1 illustrates a dual modulus prescalar divider circuit.
Figure 2:
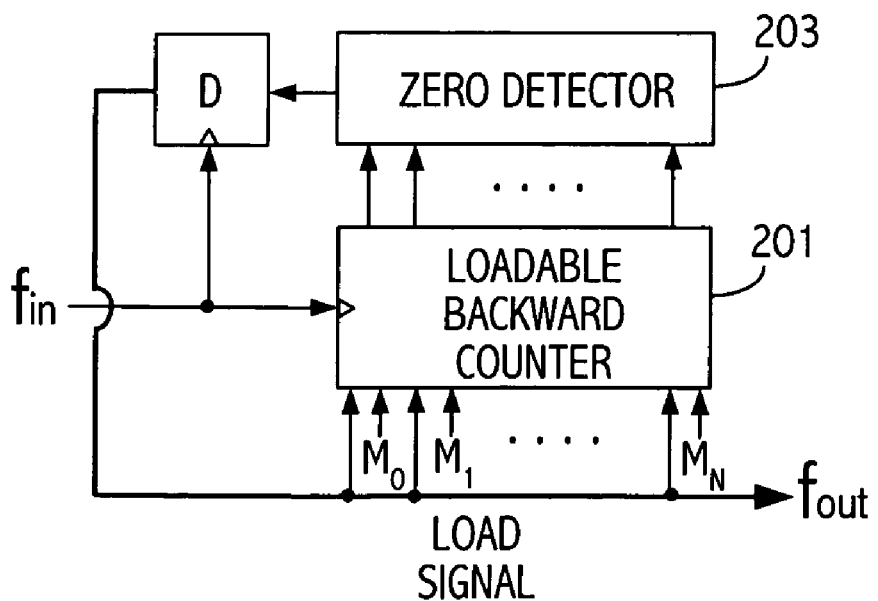
FIG. 2 illustrates programmable divider using a loadable backward counter and a zero detect circuit.
Figure 3:
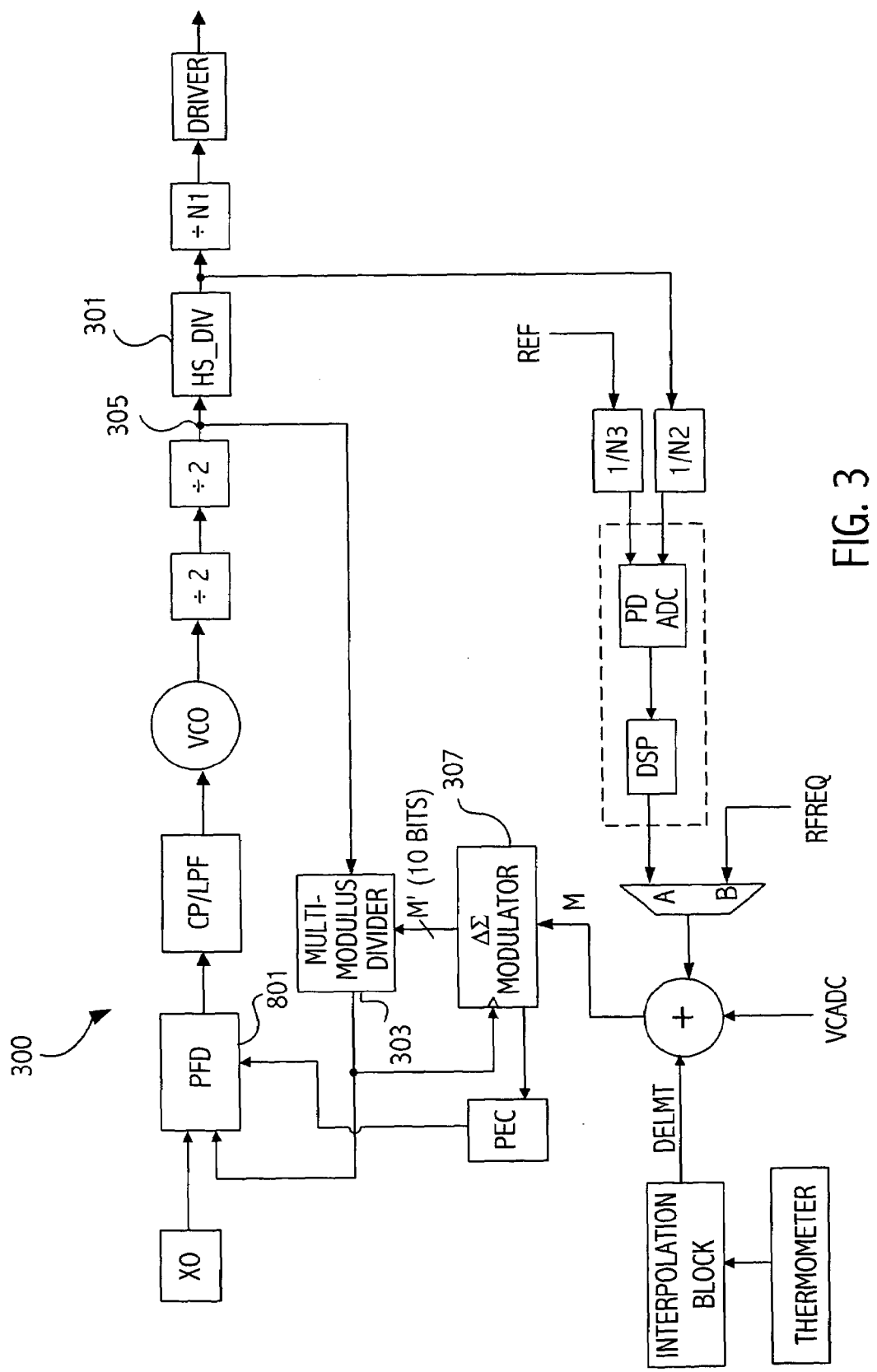
FIG. 3 illustrates a block diagram of an exemplary architecture that may utilize one or more embodiments of the divider circuit described herein.

Referring to FIG. 3 a block diagram illustrates an exemplary architecture 300 that may utilize divider circuits incorporating embodiments of the invention in, e.g., divider circuits 301 and 303. A divider circuit according to an embodiment of the invention is utilized to divide a clock signal supplied on node 305. In the exemplary embodiment illustrated in FIG. 3, the divider circuits 301 and 303 receive a clock signal supplied at node 305 that is approximately 2.5 GHz.

Figure 4:
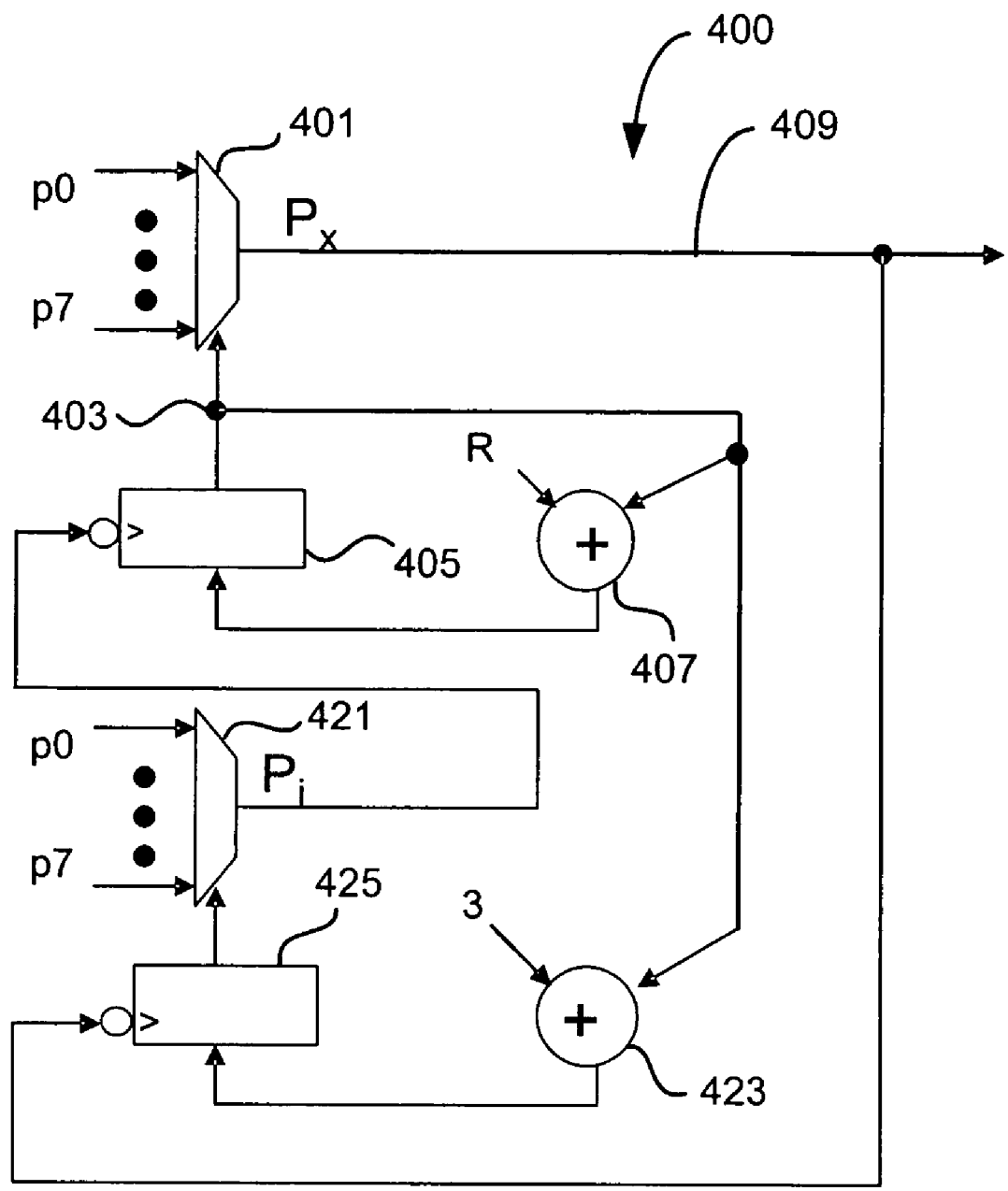
FIG. 4 illustrates a block diagram of a phase selectable divider circuit according to an embodiment of the invention.

Before describing divider circuit 303 in more detail in a specific implementation, a more general discussion of a phase selectable divider circuit will be provided. Referring now to FIG. 4 illustrated is a block diagram of a divider circuit 400 according to an embodiment of the invention. Eight clock signals P0–P7 are supplied to selector circuit 401. In the illustrated embodiment, selector circuit 401 is implemented as a multiplexer. A three bit control signal 403 supplied from register 405 selects which of the clock signals P0 to P7 is output by the selector circuit.

Figure 5:
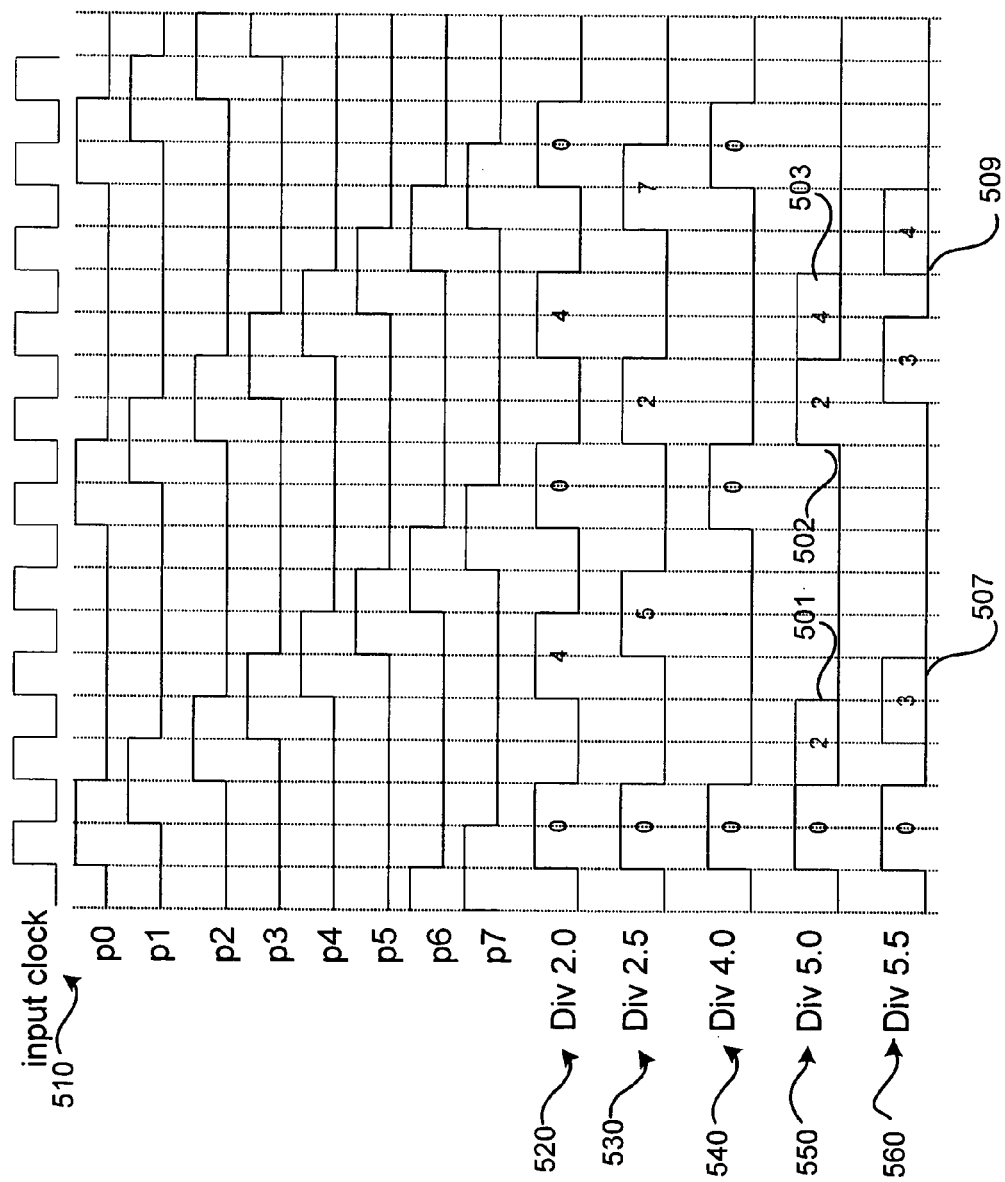
FIG. 5 illustrates a timing diagram associated with the phase selectable divider circuit of FIG. 4.

Referring to FIG. 5, a timing diagram illustrates the clock signals supplied to multiplexer 401 and waveforms supplied by the multiplexer 401. The clock signals P0–P7, having a different phase, are supplied to the multiplexer 401. Note that the pulse width of the clock signals P0–P7 may vary as described further herein. By selecting which clock signals are supplied by multiplexer 401, different frequency clock signals can be generated by the divider circuit. As shown in FIG. 5, the clock signals P0–P7 are derived from an input clock 510. In one embodiment input clock 510 is approximately 2.5 gigahertz and the clock signals P0–P7 are one fourth of the input clock signal 510, or approximately 625 MHz. Referring again to FIG. 4, the divider circuit 400 selects the next pulse to be output by adding a value R to the current select signal 403 in summing circuit 407 to generating a sum that is supplied to register 405.

FIG. 6 illustrates values of R utilized in one embodiment of the invention. The use of the divider circuit 400 to generate a clock signal that is divided down from the input clock signal 510 will now be illustrated with reference to FIG. 5. Assume it is desired to divide the input clock signal by 2. Referring to FIG. 6, it can be seen that in order to divide by 2 (the division factor), the appropriate value of R is 4. Assume that the currently selected clock is P0, so the select signal supplied from register 405 will be configured to select P0, e.g., using a value of 000. In order to select the next pulse output by the multiplexer, the summing circuit 407 adds the current value supplied from register 405 (which is 000) with the value of R (which is 4) and provides a sum of 4 to register 405 to select P4 as the next pulse output by multiplexer 401, as illustrated by the clock signal 520 (Div 2.0) shown in FIG. 5. The summing circuit 407 is implemented as a modulo N summing circuit where N equals the number of clock signals supplied to multiplexer 401, which is 8 in the illustrated embodiment. With 4 as the current value of the select signal supplied by register 405, the next value supplied as the select signal is 0, which selects P0 as the next pulse to be output by the select circuit 401. That is, 4 (the value of the select signal)+4 (the value of R)=0 in a modulo 8 summing circuit. R is continually added to the current select value to generate the next pulse and a sequence of pulses selected from the phases P0 and P4 is output as shown in FIG. 5 to generate an output clock signal that equals the input clock/2.

A divide by 2.5 will now be described. Assume that the currently selected clock is P0, so the select signal on control lines 403 will be configured to select P0, e.g., using a value of 000. Referring to FIG. 6, in order to divide by 2.5 (the division factor), the value of R is 5. The summing circuit 407 provides a sum of 5 to register 405 to select P5 as the next pulse output by multiplexer 401, as illustrated by the clock signal 530 (Div 2.5) shown in FIG. 6. With 5 as the current value of the select signals, the next value supplied as the select signal is 2, which selects P2 as the next pulse to be output by the select circuit 401. That is, 5 (the value of the select signal)+5 (the value of R)=2 in a modulo 8 summing circuit. R is added to the current select value to generate the next select value, which is supplied to the select circuit. The next pulse selected is P7.

In the general case, for the circuit shown in FIG. 4, given 8 phases of a clock, with p(n) being the phase selected at a time "n", phase selection is accomplished by p(n+1)=(p(n)+R) mod 8. FIG. 5 also shows the pulses 540, 550, 560, selected, respectively for divide by 4, 5 and 5.5.

Referring to FIG. 6, note that for the embodiment illustrated in FIG. 4, the first three divide values (0.5, 1.0, 1.5) are not available. Also for longer divide operations, for example, divide by 4.5, 5, or 5.5, where R=1, 2, or 3, the first pulses output in the longer divides need to be ignored. This is illustrated in FIG. 5. Thus, for example, for a divide by 5, and assuming P0 is the initial pulse out, and R=2, the first P2 pulse 501 is ignored but the second P2 pulse 502 is supplied by multiplexer 401. Similarly, after the second P2 pulse 502 is supplied, the first P4 pulse 503 is ignored. With the first pulse ignored each time, the effective value of M=9. The resultant waveform 550 supplied on node 409 is labeled Div 5.0 in FIG. 5. Similarly, the initial pulses 507 and 509 shown in FIG. 5 are ignored in a divide by 5.5 as shown in waveform 560.

Referring again to FIG. 4, in order to achieve the necessary delay for the longer divides, e.g., the divide by 5 and 5.5 shown in FIG. 5, in one embodiment a second selector circuit 421 is utilized with a second summer circuit 423 and a second register 425. A skip delay value of 3 is added to the current select value 403 in summing circuit 423. The skip delay indicates how many phase steps (each of clocks P0–P7 being a phase step) should be skipped before the select signal in register 405 is updated. As shown in FIG. 4, the output clock from multiplexer 401 on node 409 is used to update register 425 with the sum from summing circuit 423. The clock selected by multiplexer 421 is used to update the register 405. That ensures that the value of the select signals do not change until after the first pulses have been skipped for R equal to 1,2, or 3. For example, if the currently selected clock is P0 and R=1, with a skip count of 3, register 405 is not updated until P3, thereby ensuring that the first P1 pulse is skipped. Referring to FIG. 5, a skip delay of three ensures that the undesirable pulses 501, 503, 507, and 509 are not output.

Note that in some embodiments, the multiplexer 401 may be coupled to receive an input signal that is a steady state input signal, e.g., ground, in addition to the various phase sets received. In that way, the multiplexer may be selected to output no signal by selecting the input coupled to ground.

Figure 7:
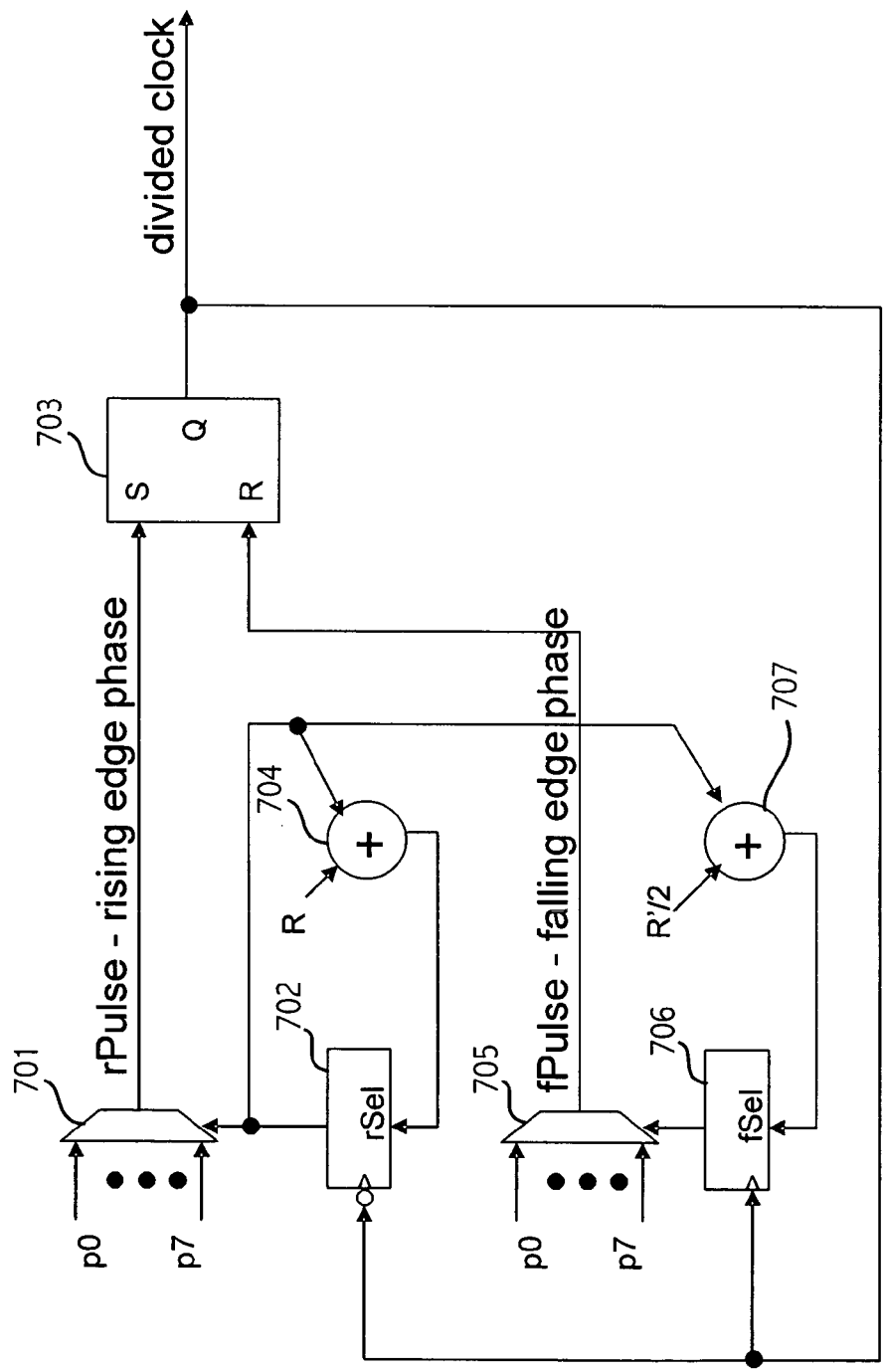
FIG. 7 illustrates another embodiment of a phase selectable divider circuit.

Referring to FIG. 7, in some embodiments, it may be desirable to make the output supplied have an approximately 50% duty cycle. That can be accomplished by using the pulse supplied by multiplexer 701 to set SR circuit 703 and using the multiplexer 705, register 706 and adder circuit 707, to create a falling edge by supplying the selected pulse supplied by multiplexer 705 to cause the SR circuit 703 to reset. In FIG. 7, summing circuit 707 is supplied with R'/2, where R' is the effective value of R, when the first pulse skip is taken into account, as shown in FIG. 6. The value of R' is shown in FIG. 6. Note that R'/2 is always greater than 3 for the divides than need to skip the first pulse. Note that in FIG. 7, the rising edge pulse (rpulse) and the falling edge pulse (fpulse) supplied by multiplexers 701 and 705, respectively, may be used as the feedback clock rather than the clock supplied by SR circuit 703. Note also that while a 50% duty cycle may be desirable in some embodiments, other duty cycles may be achieved by selecting a different phase from either or both multiplexers 701 and 705.

Figure 8:
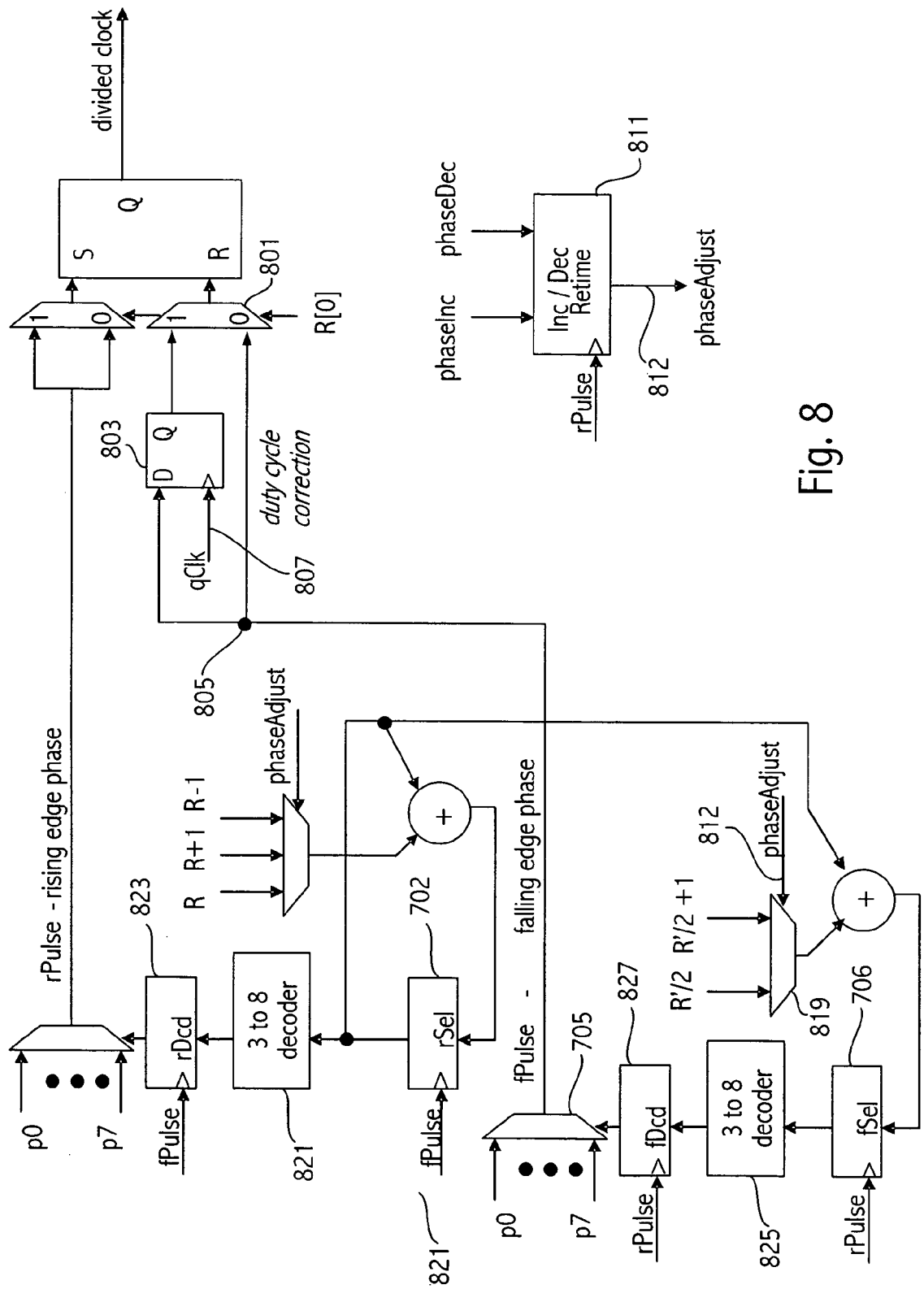
FIG. 8 illustrates another embodiment of a phase selectable divider circuit.

The signal supplied by SR circuit 703 is a signal having approximately a 50% duty cycle. However, for odd R' the duty cycle is not 50%. If a 50% duty cycle is required, duty cycle correction can be added to fpulse as shown in FIG. 8, for example, by multiplexing fpulse from multiplexer 705 with a quadrature clock delay in multiplexer 801. The delay is introduced in flip-flop 803, which receives fpulse from node 805 and is clocked by a quadrature clock 807. As shown in FIG. 8, the multiplexer 801 selects the delayed clock when the least significant bit of R is 1, indicating an odd value. In that way a 50% duty cycle clock is provided for all divide values.

FIG. 8 also illustrates additional details of the multiplexer decode, which includes a 3 to 8 decoder 821 and a decode register 823. The path to implement the falling edge also includes a 3 to 8 decoder 825 and a decode register 827.

FIG. 8 illustrates another option available, which is to introduce a phase adjust signal utilizing multiplexers 817 and 819. That allows the phase of the signal supplied by the divider circuit to be programmably adjusted. In the embodiment illustrated in FIG. 8, the phase adjust that can be introduced is one phase step (R+1 or R−1). In other embodiments, different phase adjust increments may be utilized. The multiplexer select signal phaseAdjust 812 supplied to multiplexers 807 and 809 is generated in circuit 811.

Figure 9:
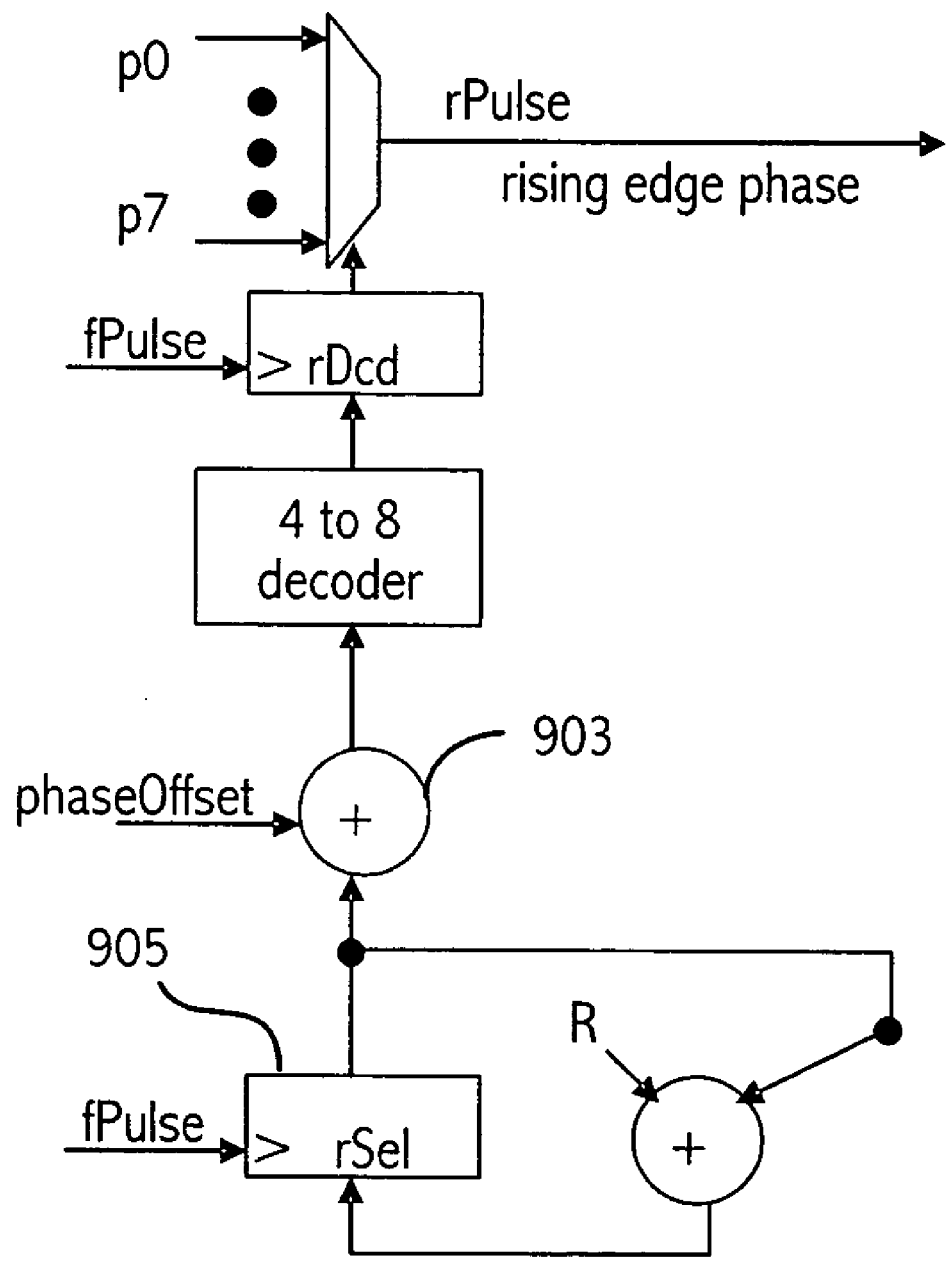
FIG. 9 illustrates another embodiment of a phase selectable divider circuit.

In some embodiments, as shown in FIG. 9, timing considerations may make it advantageous to separate the phase offset calculation into a separate summing circuit 903 and allow summing circuit 901 to just calculate the new select value provided to register 905.

Figure 10:
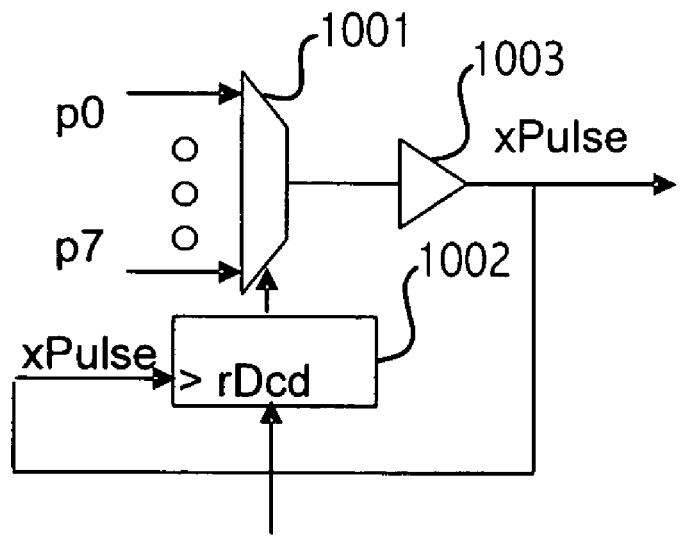
FIG. 10 illustrates timing aspects of an embodiment of a phase selectable divider circuit.
Figure 11:
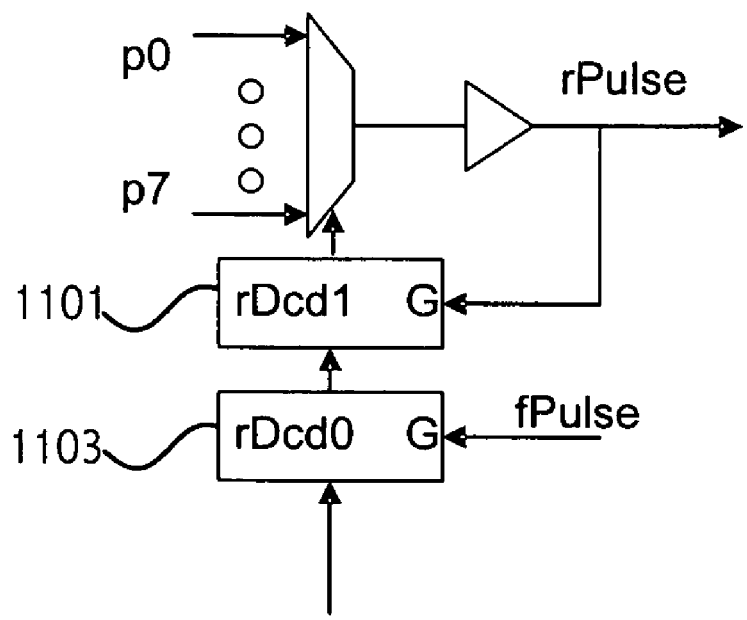
FIG. 11 illustrates an embodiment of a phase selectable divider circuit that addresses timing aspects.

In some implementations, the timing loop from multiplexer 701 to SR circuit 703, to the select register 702 back to multiplexer 701 may be too long in some process technologies. The same is true for the timing loop from multiplexer 705 to SR circuit 703, to select register 706 and back to multiplexer 705. Thus, for some embodiments, in order to achieve appropriate operational speed, the timing loops should be reduced. FIG. 10 illustrates one approach to a reduction in the timing loops. The delay from SR circuit 703 is removed and select register 1002 is clocked on the rising edge of the xpulse signal. That eliminates another one half period of delay. However, xpulse is not "clean" any more. If the delay through 1001, 1002 and 1003 totals less than the pulse width of the clock signals P0–P7, the output rpulse of multiplexer 1001 will be cut short. In some embodiments a minimum pulse width of rpulse is required. Since the one half period of delay is removed, extra pulses may be created when dividing by 4.5, 5.0, or 5.5. A two phase latch based design using latches 1101 and 1103 as illustrated in FIG. 11 may be used to so that the extra pulses do not cause a problem. Note that multiplex decoding, phase offset and pipeline can be added as long as the multiplex select output paths remained balanced.

Figures 12A, 12B, 12C:
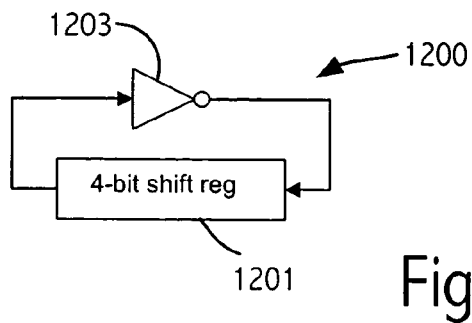
FIG. 12A illustrates count sequence generation logic used in a non-binary arithmetic circuit.
FIG. 12B illustrates the sequence of states sequences through by the count sequence generation logic of FIG. 12A.
FIG. 12C illustrates operation of a non-binary arithmetic circuit.
Figure 13:
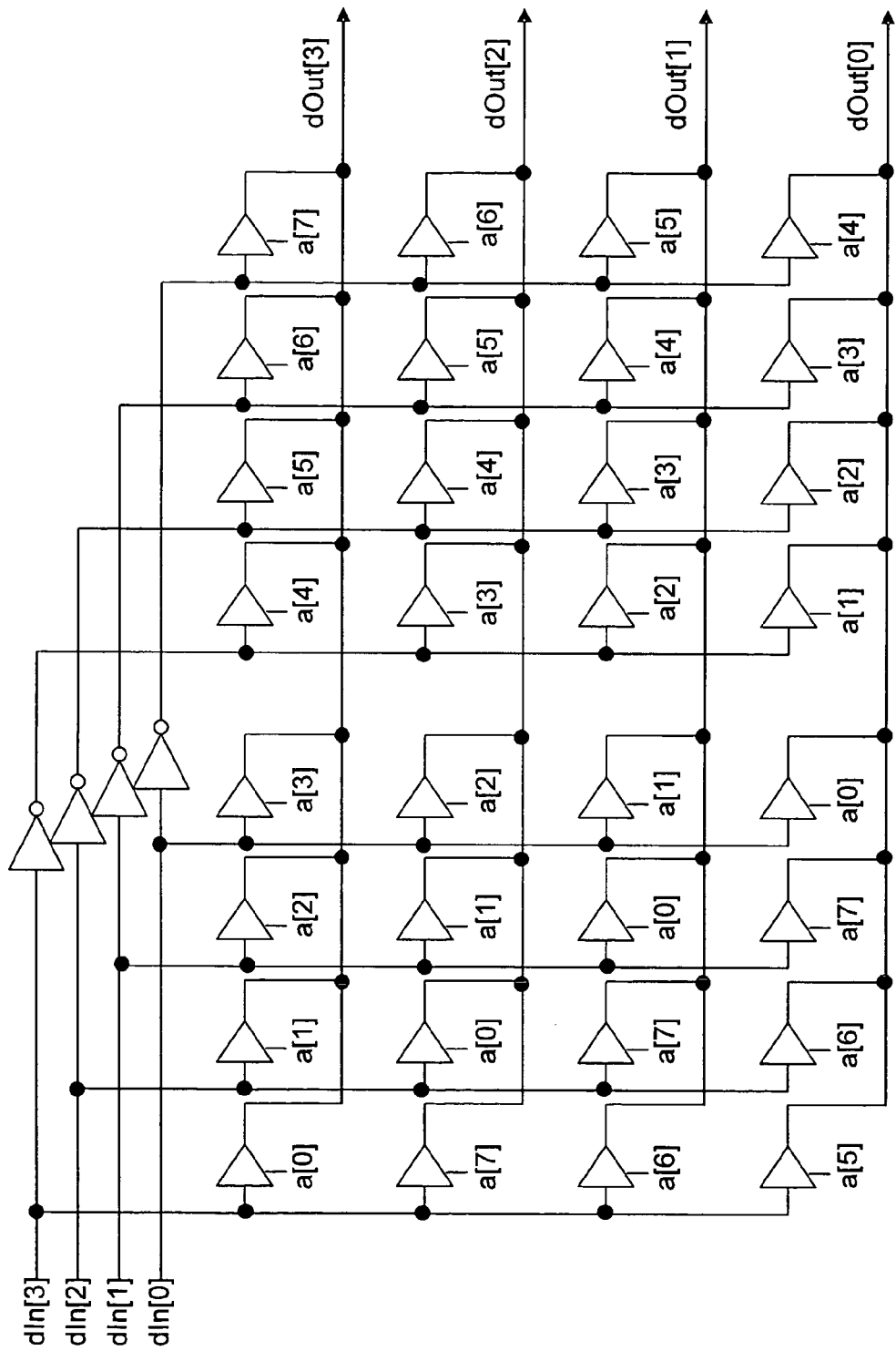
FIG. 13 illustrates an exemplary non-binary arithmetic circuit.

In another embodiment, in order to increase the speed of the adder circuits, e.g., 704 and 707, non-binary arithmetic may be used. Referring to FIGS. 12A–12C operation of an exemplary non-binary arithmetic circuit is illustrated. The illustrated embodiment relies on count sequence generation logic 1200 that includes a shift register 1201 and inverter 1203 as illustrated in FIG. 12A. The count sequence generation logic 1200 sequences through 8 states illustrated in FIG. 12B. FIG. 12C illustrates operation of the non-binary arithmetic. Assuming the current state is {d,c,b,a}. All next states are in this sequence: {d, c, b, a, ~d, ~c, ~b, ~a, d, c, b}, which are the eight possible states generated by the count sequence generation logic 1200. The subsequent state is based on the addend (+0 to+7) as shown in FIG. 12C. For example, assume the current state of the four bit shift register is 3 (011X)={d, c, b, a}. Assuming two is added the result is {b, a, ~d, ~c}=1X10, which from FIG. 12B equals 5. Thus, the addition operation includes shifting and inverting but no carry. An exemplary adder circuit is illustrated in FIG. 13. Note that addend (a) is 1-hot encoded.

Figure 14:
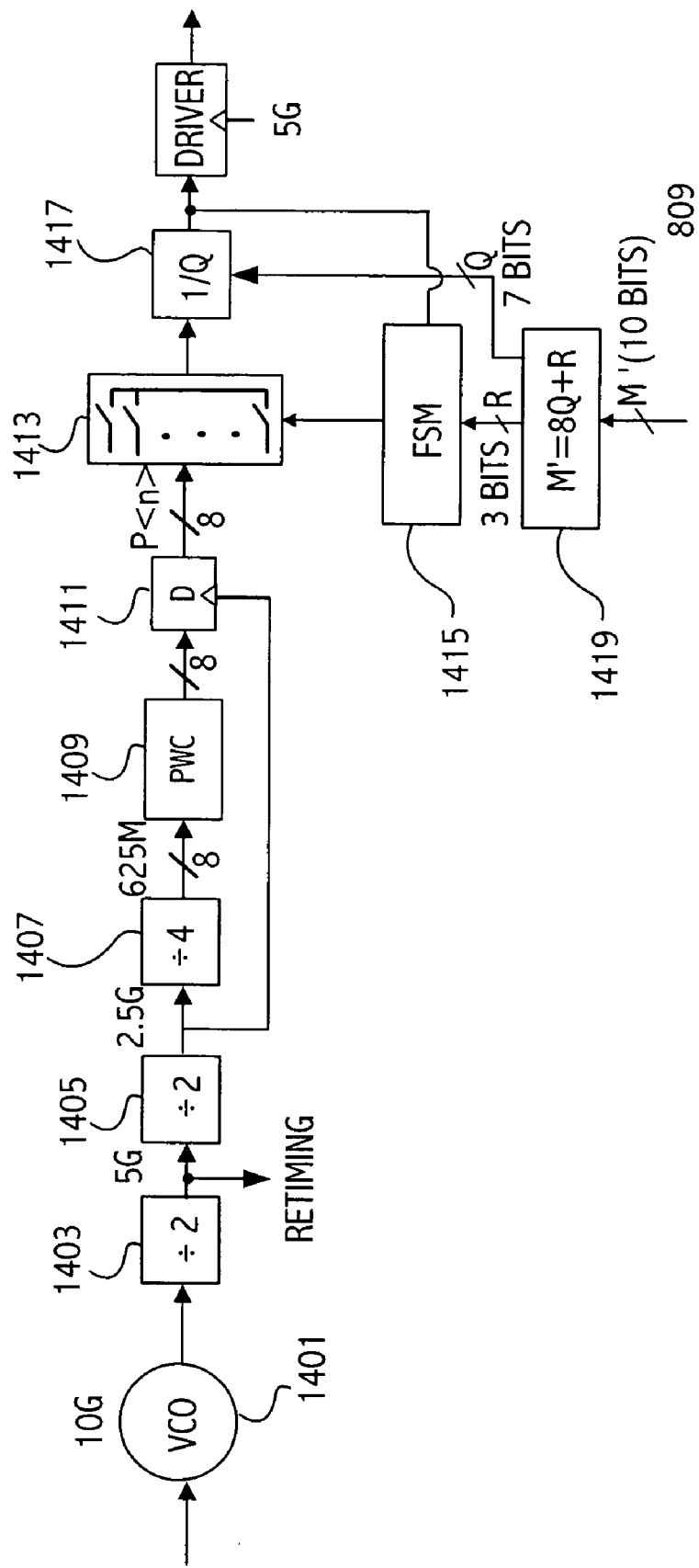
FIG. 14 illustrates a block diagram that includes a phase selectable divider circuit according to an embodiment of the invention.

Referring to FIG. 14, a block diagram illustrates a multi-modulus programmable divider circuit according to an embodiment of the invention. A voltage controlled oscillator 1401 provides an approximately 10 GHz clock signal, which is divided down in dividers 1403 and 1405 to an approximately 2.5 GHz clock signal. In order to operate the divider at a high frequency with low power consumption, some embodiments avoid feeding control signals to the high-speed circuitry. Instead, one embodiment utilizes a minimum number of transistors in the high speed portion to save power and take advantage of the multiphase output of a divider described herein to achieve equivalent speed. The programmability is pushed into the lower frequency circuitry. The 5 GHz signal from node 1403 is fed to a cascade of two dividers, divider 1405, which is a divide-by-two (/2) and divider 1407, which is a divide-by-four phase generator that generates 8 different phases. Divider 1407 supplies pulse width controller (PWC) 1409, which in turns supplies an 8-to-1 phase selecting multiplexer 1413 through flip-flops 1411. The phase selecting multiplexer 1413 directs one of the eight (8) phases from the PWC 1409 to its output. The output of the multiplexer 1413 is used to clock a divide-by-Q counter (/Q) 1417, which generates the divider output. The divider circuit 1417 may be implemented as a variable divider circuit as described further herein. The output is also used to trigger a finite state machine (FSM) 1415, which implements the multiplexer control (phase selection) algorithm.

Figure 15:
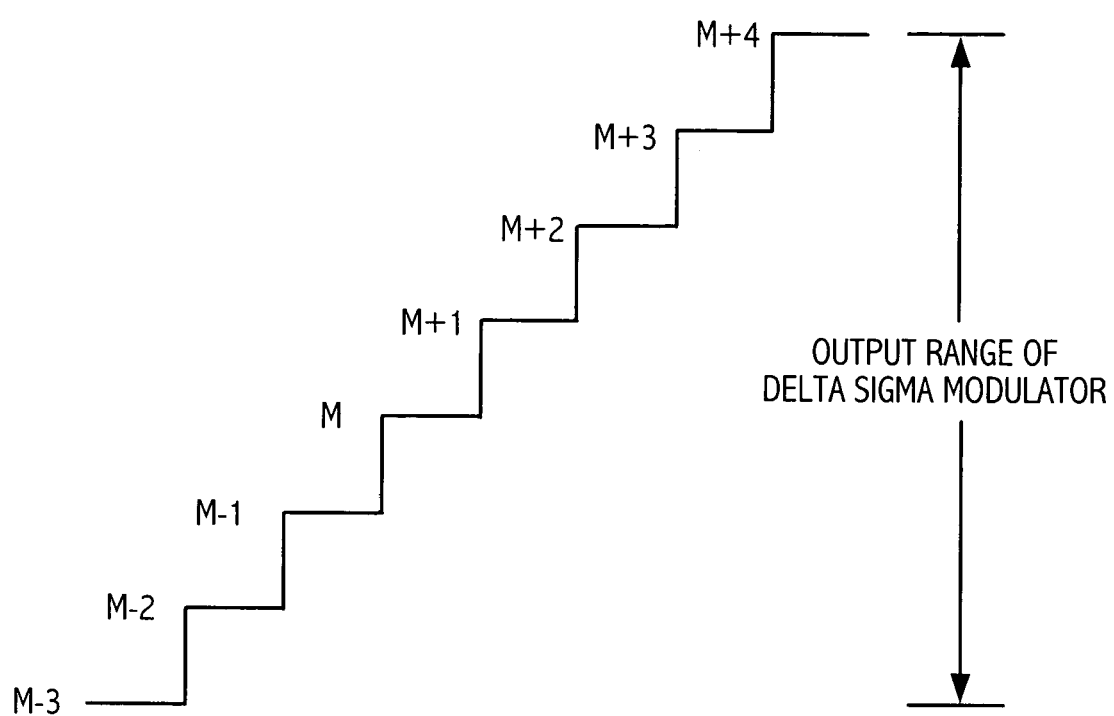
FIG. 15 illustrates an exemplary output range of the delta sigma modulator supplying a divide ratio.

In one embodiment, as illustrated in FIG. 14, block 1419 is supplied a stream of integers M' by a delta sigma modulator (see delta sigma modulator 307 in FIG. 3) to provide fractional n divide capability. M' is a sequence of integers that approximates the rational number M. Note that in some embodiments, block 1419 may be incorporated into the finite sate machine 1415. Assuming the input frequency is $f_{in}$ and the output frequency is $f_{out}$, the divide ratio $M=f_{in}/f_{out}$. In one embodiment M=((9.7 GHz~11.32 GHz)/2)/(10 MHz (Xoxc)~320 MHz (SAW)). Thus, M=15.15625~566. In one embodiment the delta sigma modulator is an eight level quantizer that expands the fractional range to M−3 to M+4 as illustrated in FIG. 15. The delta sigma modulator may be implemented, e.g., as a third order delta sigma modulator. Given that expansion of the fractional range of M, M ranges from approximately 12 to approximately 570. The divider circuit illustrated in FIG. 14 operates fundamentally as an integer divider with the M' value updated at a frequency varying from approximately 416 MHz for an M value of 12, to an update frequency of approximately 9 MHz for an M value of 570.

The operation of the divider described in FIG. 14 can be understood from the following arithmetic expression:

$$8\frac{Q}{\mu'}$$

$$\frac{-8Q}{R}$$

where Q is the quotient and R is the remainder, and M' is the divider ratio. From that arithmetic expression, the divide ratio M'=8Q+R. The divide ratio is thus split into a constant coefficient (here 8, although other numbers are of course possible) multiplied by a quotient Q, which is >=1 and a remainder (R). The R portion is implemented through the phase-selecting multiplexer 1413 being controlled by the finite state machine (FSM) 1415. Control logic 1419 receives the divide ratio M', splits it into two portions, a Q number and an R number. The Q number is sent to Q divider input bits, while the R number is used by the finite state machine 1415, which is described further herein. The 8Q value can be understood as a coarse tuning capability, while the R value provides a finer tune capability. Note that FIG. 4 may be thought of as a special case of FIG. 14 where Q=1, thus providing a narrower divider range than embodiments where a Q divider is utilized.

The divide by 8, the constant coefficient can be accomplished in the higher speed divide circuits 1405 and 1407. The divide by Q and the divide by R can be performed in lower speed circuitry. The divide by Q can be performed in variable divider circuit 1417, which has a much lower input frequency, thus can be implemented with low speed circuitry. The divide by R can be achieved in the phase selecting multiplexer 1413. The multiplexer 1413 chooses the phase that is R steps offset (R can be positive or negative) from the last phase in each cycle of the output, thus achieving the division factor 8Q+R. By varying both Q and R, flexible programmability is achieved. Various values of R may be utilized examples of which are shown below:

R=(−4, −3, −2, −1, 0, 1, 2, 3)
R=(−3, −2, −1, 0, 1, 2, 3, 4),
R=(−2, −1, 0, 1, 2, 3, 4, 5),
R=(−1, 0, 1, 2, 3, 4, 5, 6),
R=(0, 1, 2, 3, 4, 5, 6, 7)

In each R scheme shown above, there are 8 values corresponding to each phase step. The R scheme chosen determines the minimum available division ratio and the maximum input frequency at the input of Q counter. For example, comparing scheme R=(−4, −3, −2, −1, 0, 1, 2, 3) to R=(0, 1, 2, 3, 4, 5, 6, 7), the first scheme can achieve the minimum divide ratio of /4, while the second one can only achieve the minimum divide ratio of /8. However the first scheme requires the Q counter to be able to operate at a much higher frequency. It also imposes tighter timing requirement on multiplexer control signal generation compared to other R scheme. It also consumes more power and may require custom design of the digital circuitry.

FIG. 16 shows an example of M'/Q/R values and output frequency for input frequency of 2.5 GHz and R=(−3, −2, −1, 0, 1, 2, 3, 4). In the absence of phase switching (R=0), the divider chain in FIG. 14 has a division factor of 8Q.

Referring to FIGS. 14 and 17A, the divide-by-four phase generator 1407 produces 4 pair of differential waveforms (8 phases) p<0> to p<7>, each having a phase shift of π4 with respect to the period of waveforms p<0> to p<7>. Assuming the input clock in FIG. 17A is 5 GHz, the divide by eight clocks produced are 625 MHz. In the illustrated embodiment, the pulse width is half of the period of the divide by eight clock produced. In some embodiments, in order to make phase switching backward possible (R<0) and prevent pulse overlap and glitching generation while switching from one phase to the other, the pulse width control (PWC) block 1409 is utilized.

Figure 18A:
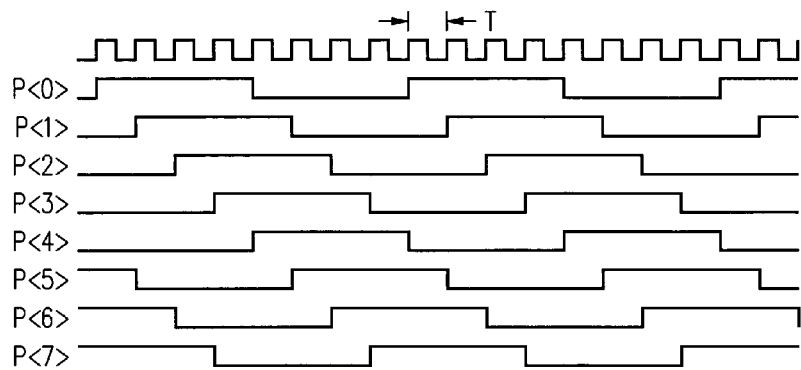
FIG. 18A illustrates timing diagram associated with generation of signals having different phases.
Figure 18B:
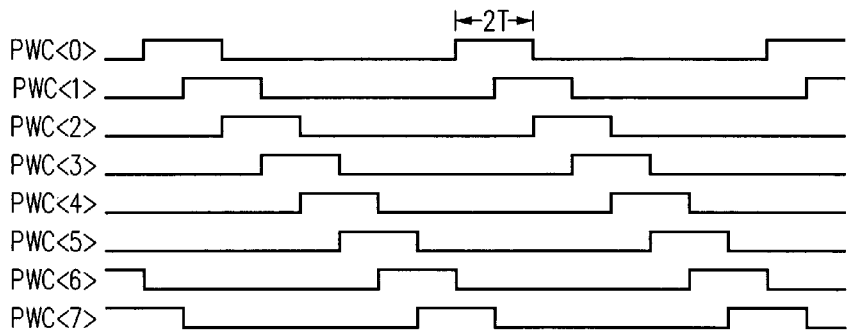
FIG. 18B illustrates generation of signals having a particular pulse width being supplied to a phase switching multiplexer circuit according to an embodiment of the invention.
Figure 18C:
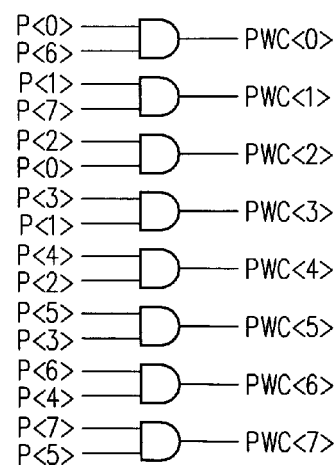
FIG. 18C illustrates a circuit useful to generate the signals in FIG. 18B from the signals in FIG. 18A.

The PWC block 1409 regenerates these multiphase outputs from four phase generator 1407 into clocks pwc<0> to pwc<7> as shown in FIG. 17B by shrinking the pulse width from 4T to T or 2T (where 1/T is the input frequency). Choosing either a T or 2T pulse width scheme is a trade-off between circuit power consumption and the minimum R desired. If it is desirable to achieve R=−4, a pulse width equal to T would be preferred in certain embodiments, since the space between the falling edge of first pulse and the rising edge of the second pulse would be larger. However, generating a pulse width equal to T requires greater power consumption compared to a 2T pulse width generation for the same rising/falling time to pulse width ratio. One embodiment of pulse width block 1409 is shown in FIG. 17C which utilizes AND gates. For example, AND gate 1701 logically combines p<0> and p<5> to generate the clock signal pwc<0> having a pulse width T. A similar approach can be used to generate pulse width of 2T as illustrated in FIGS. 18A–18C.

Figure 19:
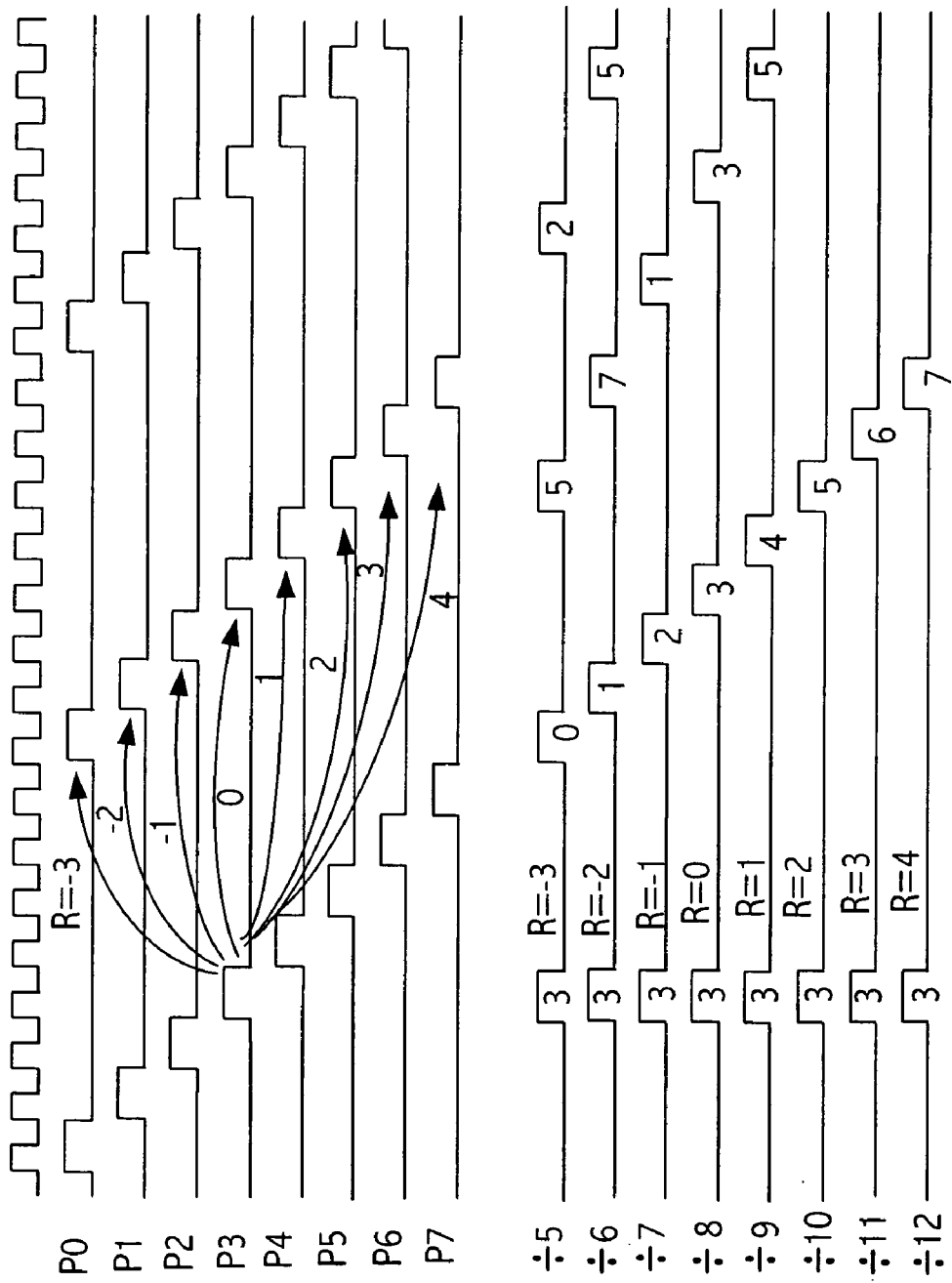
FIG. 19 illustrates operation of the divider circuit in FIG. 14 according to an embodiment of the invention.

FIG. 19 shows how the phase switching multiplexer 1413 functions to generate a divided clocks in one embodiment. The divide values illustrated in FIG. 19 are divide by 5, 6, 7, 8, 9, 10, 11, 12. Other divide values are of course possible. Note that in the illustrated embodiment, R is a value that indicates by how much the next pulse lags or leads the phase of the currently selected clock. Negative R represents the phase switching to an earlier phase (lags current phase) while positive R indicates that the phase of the next pulse leads the current pulse. To have a divide ratio less than 8 (e.g. /5, /6, /7) the phase is switched periodically to a waveform that is leading the current waveform by R * π/4, where R=−1 for /7; R=−2 for /6; R=−3 for /5. To have a divide ratio>8, the phase is switched periodically to a waveform that is lagging the current waveform by R π/4, where R=1 for /9; R=2 for /10, R=3 for /11 and R=4 for /12.

Assume the pulse currently selected by multiplexer 1413 selected pulse is P3. The next pulse to be selected based on an R value from −3 to 4 is illustrated. Thus, for R=−3, the next pulse is P0 which leads the next P3 pulse that would otherwise be output if the multiplexer continued to output the currently selected clock. Similarly, for R=4, the next pulse selected is P7, which lags the next P3 pulse that would otherwise be output (if R=0) by 4 pulse steps. FIG. 19 also illustrates the divided clocks generated by the phase selecting multiplexer for divide by 5, 6, 7, 8, 9, 10, 11, and 12.

Figure 20:
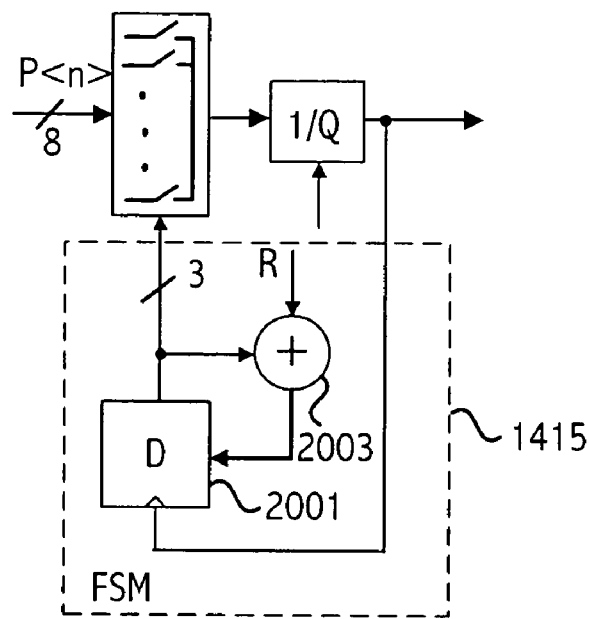
FIG. 20 illustrates an exemplary finite state machine that may be used in the divider circuit of FIG. 14.

FIG. 20 illustrates a block diagram of one embodiment of finite state machine 1415. Other embodiments may utilize the control structures described herein and illustrated, e.g., in FIGS. 4, 7, or 8. In FIG. 20, the FSM includes modulo summing circuit 2003 that supplies storage location 2001 the new select value. The storage location 2001 is updated by the divider clock supplied on node 2005. For each output cycle, the FSM updates to the new phase by adding R phase steps (R value can be negative) to the currently selected value. Note that in some embodiments, both the Q counter and FSM can be implemented with standard cells synthesis since they both operate at relative lower frequency.

Figure 21:
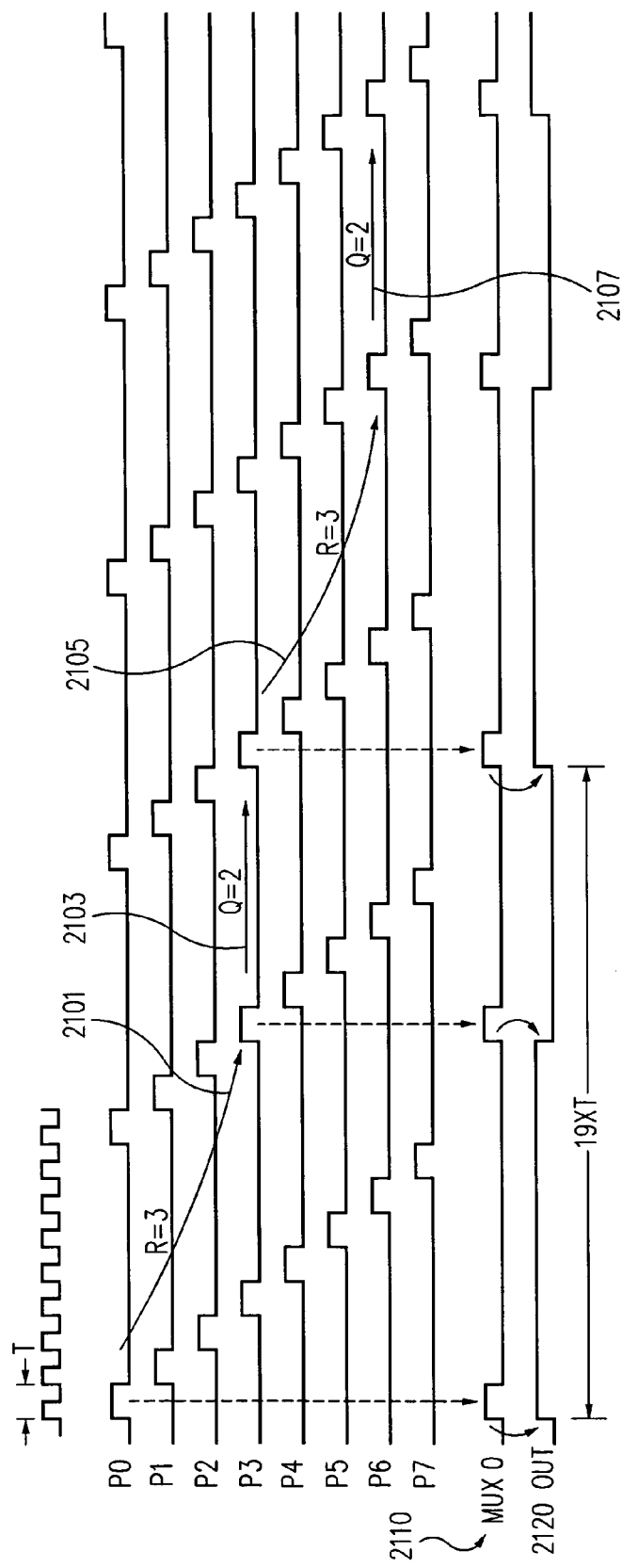
FIG. 21 illustrates an example of a divide by 19 according to an embodiment of the invention.

Referring to FIG. 21, a timing diagram illustrates an example of building an output clock for a divide ratio of M'=19 utilizing the divider illustrated in FIG. 14. As shown in FIG. 14, a 10 bit M' value is supplied to block 1419 from the delta sigma modulator (not shown in FIG. 14). The finite state machine 1415 receives three bits specifying the value of R and the variable divider circuit 1417 receives a 7 bit Q value specifying the Q divider value.

For the divide by 19 example shown in FIG. 21, M'=8*2+3, where Q=2 and R=3. Assuming the current phase selected by multiplexer 1413 is P0, which is the first pulse of the output from the multiplexer shown in waveform 2110 (mux0) in the timing diagram of FIG. 21. With R=3, and Q=2, the next pulse out is P3 as indicated by arrow 2101. With Q=2, two pulses pass through phase select multiplexer 1413 (FIG. 14) at this phase before the sum generated by sum circuit 2103 is updated in select register 2101. The arrows 1902, 1905, and 1907, show the pulses output by phase selector multiplexer 1413 under control of FSM 1415. The resultant waveform 2110 is shown in FIG. 21. The signal supplied on Qout is also shown. With R=2, the output from the multiplexer is divided by two. For the illustrated embodiment, the period of the waveform from the divider circuit 1417 is 3800 picoseconds, which is 19 times longer than the 200 picosecond period of the 5 GHz clock signal.

Figure 22:
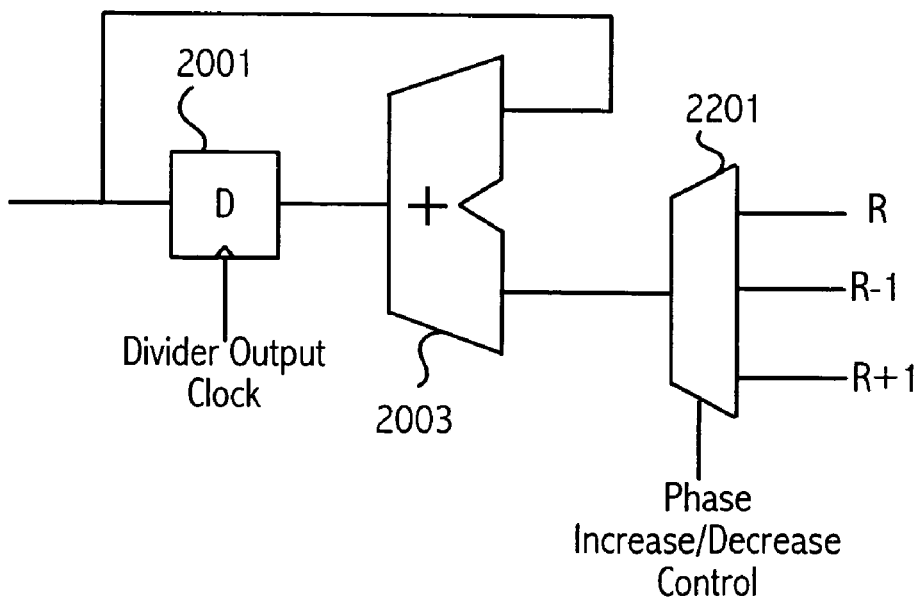
FIG. 22 illustrates a circuit for dynamically adjusting the output phase.

Certain applications require that the frequency synthesizer provide digitally controlled output phase adjustment (e.g. for system clock skew compensation). Such capability was described with relation to FIG. 8. FIG. 22 illustrates how the FSM of FIG. 20 can be modified to achieve this capability. Multiplexer 2201 selects which value of R is supplied to the summing circuit 2003. To have an output clock phase increment (or decrement) by 400 ps (assuming, for example, a 2.5 GHz input frequency), the multiplexer selects the next (or previous) phase (waveform). For example, when phase increase control=1, multiplexer 2201 selects R+1. When it is desired to decrease phase, the phase decrease control is set to one and multiplexer 2201 selects R−1. If no phase adjustment is required, multiplexer 2201 continues to select input R.

Figure 23:
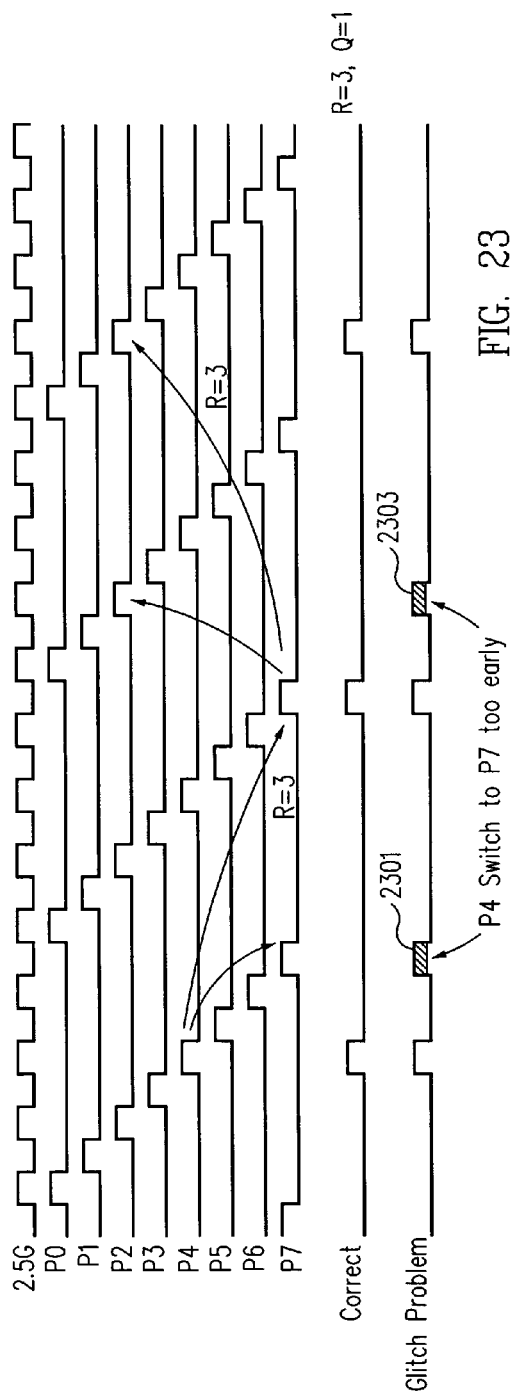
FIG. 23 is a timing diagram illustrating how glitches may occur.

Undesired glitches can occur when switching from one phase to the other if appropriate precautions are not taken. FIG. 23 shows an example of divide by 11 (Q=1, R=3) illustrating the potential problem. Assuming P4 is the initial pulse and R=3, there is potential for P4 to switch to P7 too early as illustrated by pulses at 2301 and 2303, which would result in an undesired divide ratio. To prevent that, it is necessary to appropriately control the order and timing of the phase transition. That is similar to the potential problems with long divides described in relation to FIGS. 4 and 5.

Figure 24:
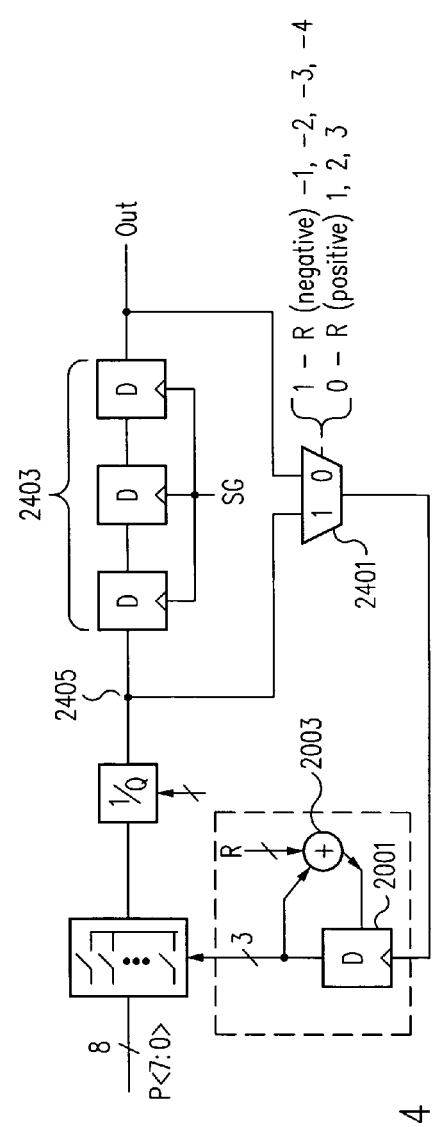
FIG. 24 illustrates an embodiment of a phase selectable divider circuit that address the problem of glitches.

Referring to FIG. 24, an embodiment is illustrated in which a delay is selectively used to clock the select register 2001 to block the unwanted pulses. When R is greater than or equal to 0, multiplexer 2401 selects a delayed clock value provided by delay circuit 2403 as the clock to update the select register 2403. When R is less than 0, multiplexer 2401 selects the Q divider output on node 2405 as the clock to update the select register 2001. In that way, the unwanted pulses shown in FIG. 23 are avoided.

Figure 25:
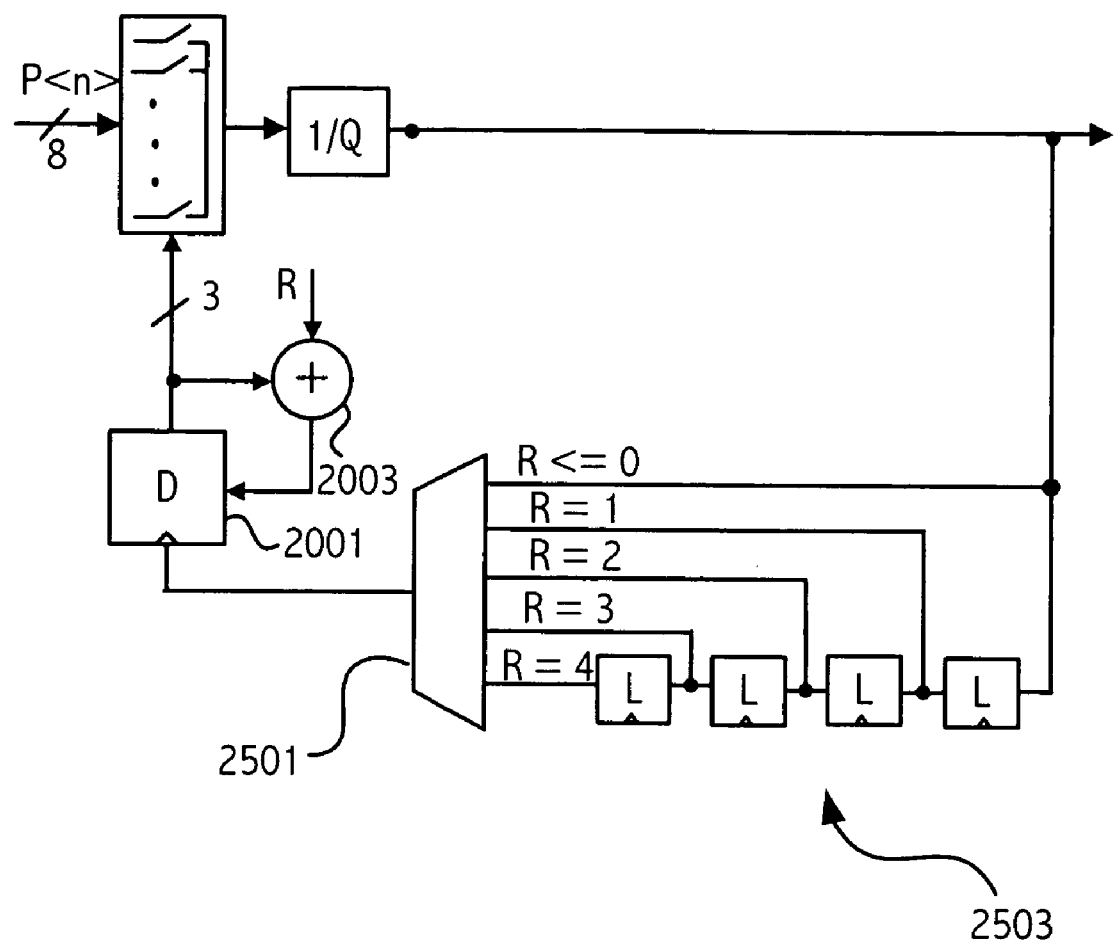
FIG. 25 illustrates an embodiment of a phase selectable divider circuit that address the problem of glitches.

FIG. 25 illustrates another embodiment to block unwanted glitches that utilizes a selectable feedback clock delay chain through a multiplexer 2501. For R<=0, no delay is need, For R>=0, the delay flip flop chain 2503 is utilized. The delay chain is tapped at each latch output and supplied to the multiplexer. The multiplexer selects the appropriate clock delay based on the R value. If a half rate of the input clock to the divider is used for the trigger, only 2 D flip flips (4 latches) is needed. An alternative is to use full rate input clock to trigger the delay chain. However, compared to a full rate of input clock trigger, the half-rate scheme consumes less power and use fewer number of D flip flops. Using an even lower rate of clock (e.g. from /4) to trigger is also possible. Glitch-free phase switching can also be implemented by using an additional (supplementary) phase selecting multiplexer to generate the appropriate timing delay (or phase offset), which is then used to trigger the phase switching of the main phase selecting multiplexer as illustrated in FIGS. 4, 7, and 8.

Figure 26:
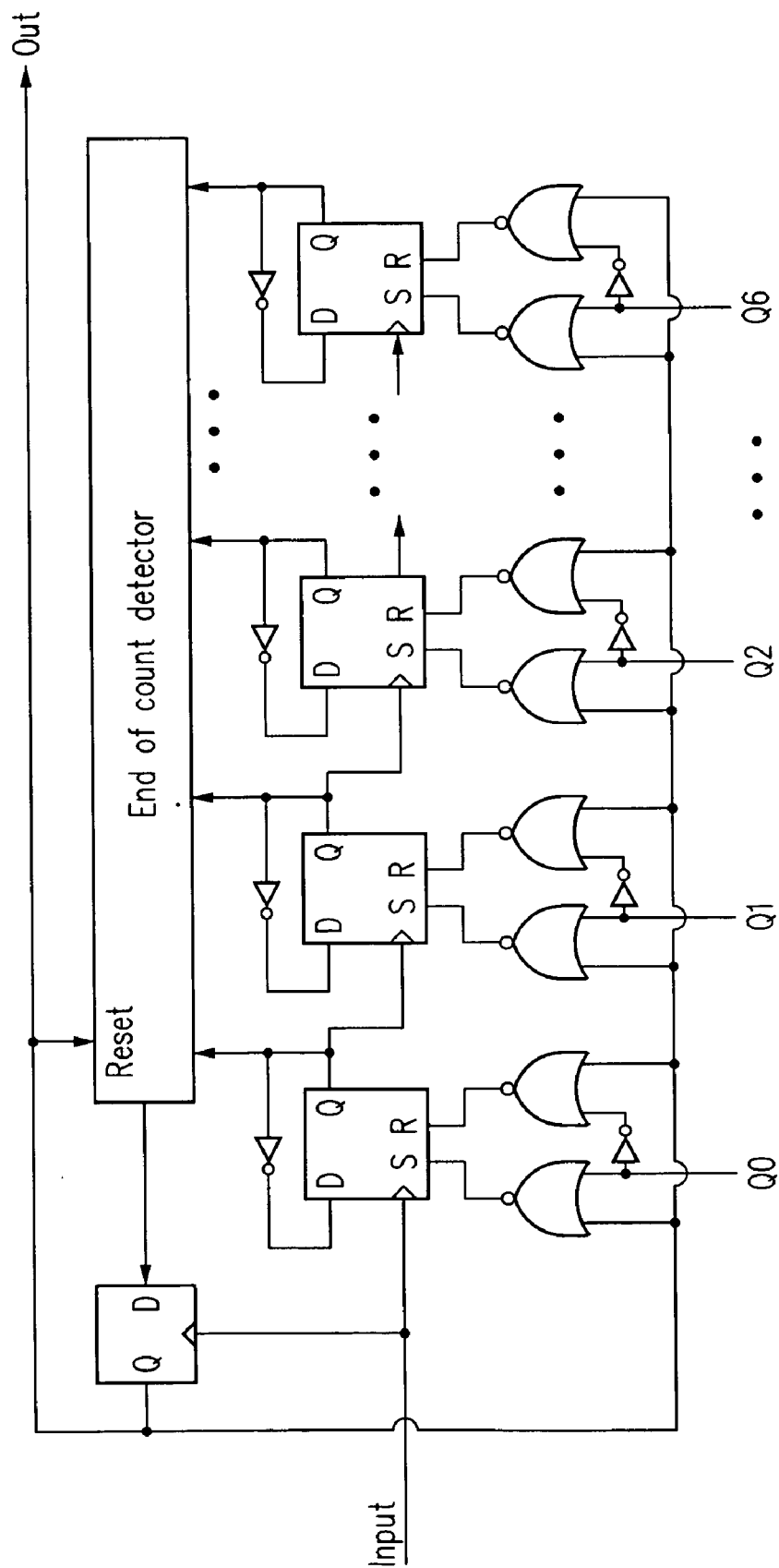
FIG. 26 illustrates an exemplary embodiment of a variable divider circuit that may be utilized in the divider circuit shown FIG. 12.

The variable divide counter 1417 may be implemented in a variety of ways well known to those of skill in the art. One such implementation is illustrated in FIG. 26, which provides a 7 bit variable divide value supplied on node Q0 to Q6.

Figure 27:
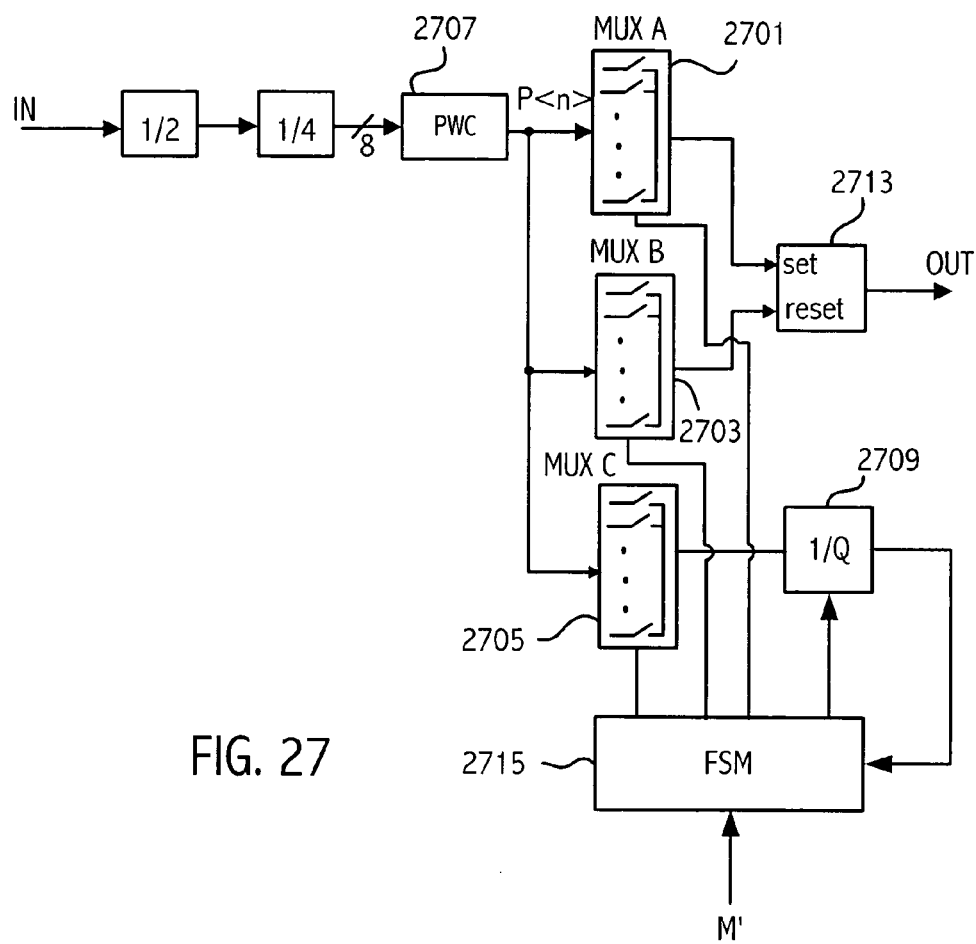
FIG. 27 illustrates an embodiment for achieving duty cycle correction.
Figure 28:
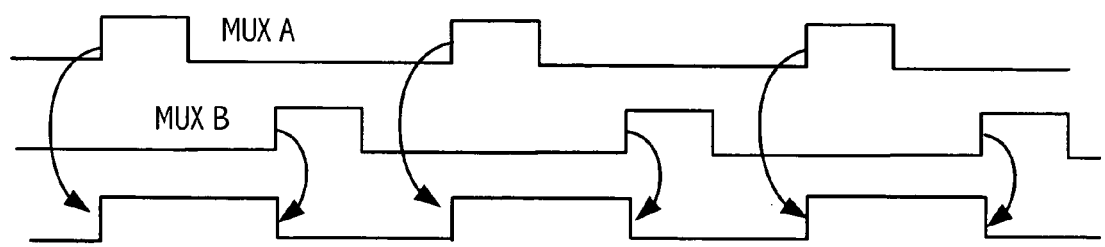
FIG. 28 illustrates operation of duty cycle correction.

Many applications require that the divider output waveform have a particular duty cycle, e.g., 50%. One approach to achieving duty cycle correction is illustrated in FIGS. 7 and 8. Another embodiment implementing duty cycle correction with two additional phase switching multiplexers and a set/reset latch is shown in FIG. 27. There are three phase switching multiplexers 2701 (mux A), 2703 (mux B), and 2705 (mux C) connected to PWC output 2707. The output of multiplexer 2705 is connected to the Q divider 2709, which generates the expected output frequency and is used for clocking the finite state machine (FSM) 2715. Multiplexer 2701 and multiplexer 2703 are used to generate the two waveforms that have a relative phase offset of a half period (for 50% duty cycle) of the output waveform. The two waveforms are generated and combined through a set/reset latch 2713. The waveform from multiplexer 2701 is used to set the rising edge of the output waveform, while the multiplexer 2703 waveform resets the falling edge. In order to generate waveforms having a duty cycle other than 50%, the relative phase offset of the two waveforms used to set and reset the SR latch may be varied. The three sets of phase switching control signals are generated from the finite state machine (FSM) 2715. FIG. 28, illustrates operation of the embodiment illustrated in FIG. 27.

Figure 29:
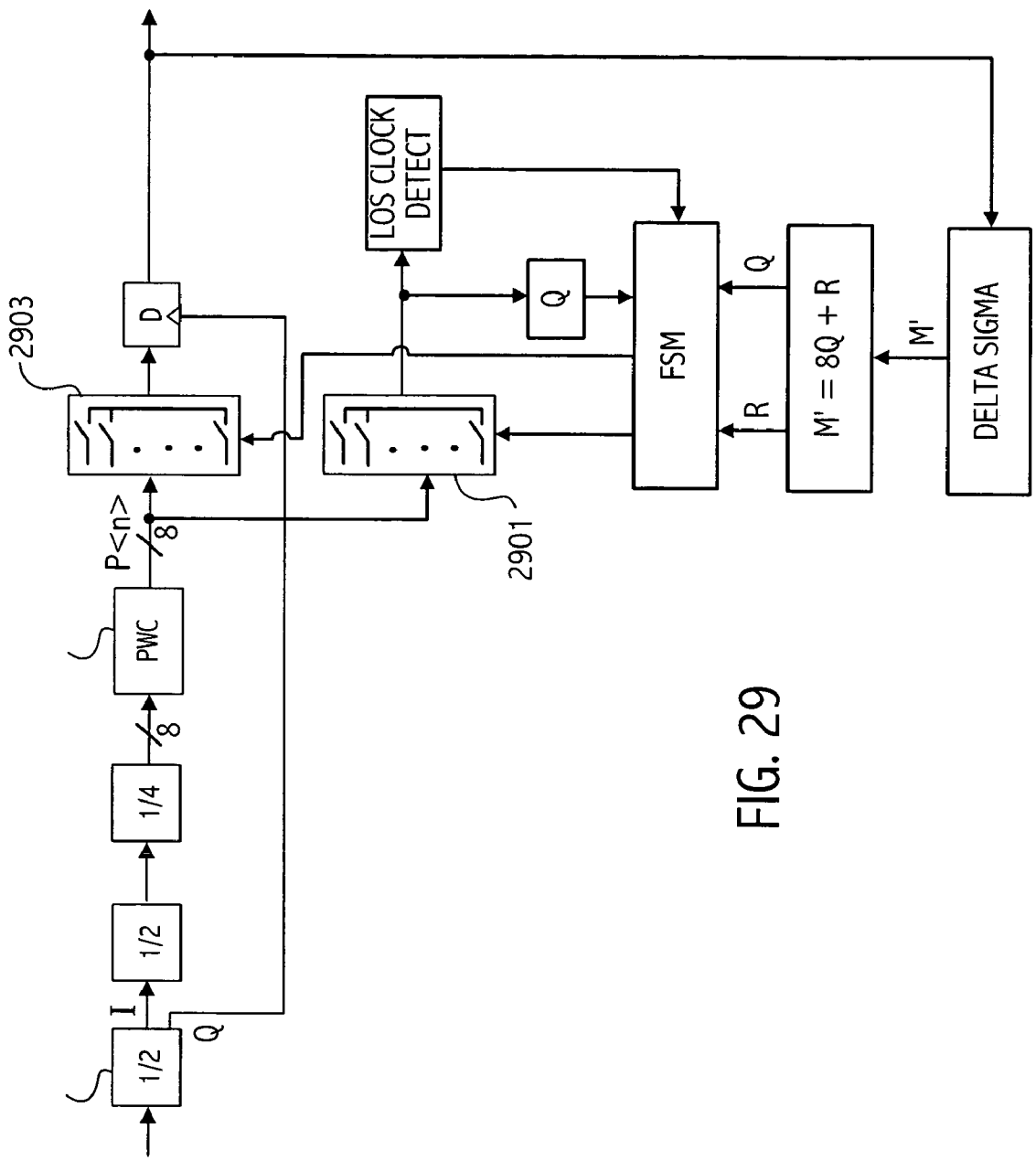
FIG. 29 illustrates an embodiment of a divider architecture that can generate a wide range of output frequencies with a specified pulse width.

Certain applications may require that the divider output waveform have a certain pulse width (e.g., an application may want the divider output waveform to have a pulse width of 800 ps for phase frequency detection (PFD) phase error cancellation (PEC)). A similar approach to the approach utilized for duty cycle correction can be used. If the desired pulse width is the same as PWC pulse width (as an alternative, the PWC pulse width be the same as desired pulse width), only two multiplexers would be needed as shown in the embodiment shown in FIG. 29. As in FIG. 27, the multiplexer 2901 is connected to Q divider, which generates the expected output frequency and used for triggering the FSM. The multiplexer 2903 periodically performs phase switching and allows the selected PWC pulse width passing through. After the pulse passes through, the multiplexer selects an input connected to ground as an OFF state. It turns on again before the next expected pulse arrives. Both sets of phase switching control signals are generated from the FSM, which includes a basic FSM structures described herein.

A loss of clock detector 2905 resets the FSM when the circuit is initially powered up or when a loss of clock is detected after power-up. When the integrated circuit powers up, there is initially no output signal from multiplexer 2901. The detector sends a reset signal to the FSM to freeze the control signals (e.g. at phase<0>) to select a clock signal to pass through the multiplexer. After the detector detects the output signal from the multiplexer, it releases the reset signal and allows the FSM to operate normally. Note that the FSM that generates the clock is running on the clock that it is generating. As a result, if after power-up the FSM gets into a state where it is no longer producing clock pulses, there is no way for the FSM to recover, without a chip reset. In order to allow the FSM to recover after such a failure, the loss of clock detection circuit constantly monitors the FSM clock and if loss of clock is detected, forces the FSM into a state that gets the clocks running again.

Thus, various embodiments of a divider circuit have been described. The description of the invention set forth herein is illustrative, and is not intended to limit the scope of the invention as set forth in the following claims. For example, while particular loop structures have been described, e.g. as illustrated in FIG. 3, various implementations of phase-locked loops, frequency locked loops, and the like are well-known to those skilled in the art, and dividers according to various embodiments of the present invention can be adapted for use in any suitable form of these or similar control loops. It should also be appreciated, that a divider according to an embodiment of the present invention is not limited to use in phase-locked loops, frequency locked loops, or the like but can be incorporated into, or used in conjunction with, any suitable circuit, device, or application in which an input signal is to be frequency divided. Other variations and modifications of the embodiments disclosed herein, may be made based on the description set forth herein, without departing from the scope and spirit of the invention as set forth in the following claims.

What is claimed is:

1. A method of dividing a first signal having a first frequency comprising:

supplying a plurality of signals to a selector circuit, the signals having a common frequency and a different phase, the common frequency being lower than the first frequency;

selecting a first of the supplied signals, having a first phase, as a selector circuit output signal;

summing at least a first value corresponding to the first phase, with a second value corresponding to a phase offset from the first phase, and generating a sum indicative thereof; and selecting a second one of the supplied signals having a second phase as the selector circuit output signal according to the sum, to generate a waveform having a frequency lower than the first frequency.

2. The method as recited in claim 1 wherein the generated waveform has a higher frequency than the common frequency.

3. The method as recited in claim 1 further comprising adjusting a phase of the generated waveform by generating the sum to be a summation of a phase offset indication and the first value and the second value, thereby changing a phase of the generated waveform according to the phase offset indication.

4. The method as recited in claim 3 wherein the phase offset indication can vary from a positive to a negative value.

5. The method as recited in claim 1 wherein sequential pulses output by the selector circuit as the selector circuit output signal are respectively from the first and second one of the supplied signals.

6. The method as recited in claim 1 wherein the second value is negative thereby indicating an earlier phase than the first phase.

7. The method as recited in claim 1 wherein the first and second phases are equal.

8. The method as recited in claim 1 wherein the first and second phases are different.

9. The method as recited in claim 1 wherein the summing utilizes modulo arithmetic, by summing ((the first value+the second value) mod N), where N is a number of signals supplied to the selector circuit having the common frequency.

10. The method as recited in claim 1 further comprising dividing the selector output signal by a third value in a variable divider circuit.

11. The method as recited in claim 10 further comprising controlling a number of pulses passing through the selector circuit sequentially with a same phase, using the third value.

12. The method as recited in claim 10 further comprising supplying the second value from a delta sigma modulator.

13. The method as recited in claim 10 further comprising selectively updating a storage location storing a select signal that controls selection by the selector circuit of the plurality of signals supplied to the selector circuit, using a selected one of a first and second update clock signal, the first and second update clock signals being selected according to whether a next signal to be output by the selector circuit, lags or leads a phase of a currently selected selector circuit output signal.

14. The method as recited in claim 13 where the first clock signal is supplied by the variable divider circuit and the second clock is a delayed version of the first clock signal.

15. The method as recited in claim 1 further comprising skipping first instances of pulses of longer divides by delaying updating a select signal controlling selection by the selector circuit of the plurality of signals supplied to the selector circuit.

16. The method as recited in claim 1 further comprising storing the sum in a storage location for use as a select signal, the select signal controlling selection by the selector circuit of the plurality of received signals, and updating the storage location using as an update clock signal a selected one of the plurality of clock signals having a phase a predetermined offset from a phase of a currently selected selector circuit output signal.

17. The method as recited in claim 1 wherein the phase offset from the first phase is indicative of a number of pulses to skip, each of the pulses corresponding to one of the plurality of the supplied signals.

18. The method as recited in claim 1 further comprising updating a storage location storing the sum as a select signal to control selection of the plurality of signals supplied to the selector circuit using an update signal that is different than a currently selected selector circuit output signal.

19. The method as recited in claim 18 wherein the update signal is a different one of the supplied signals.

20. The method as recited in claim 1 further comprising selectively delaying an update signal used to update a select signal with the sum, the select signal controlling selection of the plurality of signals supplied to the selector circuit.

21. The method as recited in claim 20 wherein the delaying is determined, at least in part, according to whether a phase of a next signal to be output by the selector circuit, lags or leads a phase of the currently selected selector circuit output signal.

22. The method as recited in claim 20 wherein the delaying is determined, at least in part, according to a phase difference between a phase of a next signal to be output by the selector circuit and a phase of the currently selected selector circuit output signal.

23. The method as recited in claim 20 wherein the delaying is determined, at least in part, according to the second value.

24. The method as recited in claim 1 further comprising determining a duty cycle of the selector circuit output signal.

25. The method as recited in claim 24 wherein determining the duty cycle of the selector circuit output signal further comprises:
receiving the plurality of signals at a second selector circuit;
selecting one of the plurality of signals as a second selector circuit output signal;
determining the duty cycle using the selector circuit output signal and the second selector circuit output signal.

26. The method as recited in claim 25 wherein determining the duty cycle further comprises:
coupling one of the first and second selector circuits to a set input of a set-reset latch and coupling a reset input to the other of the first and second selector circuits, thereby defining the duty cycle.

27. An apparatus for dividing a first signal to generate a lower speed signal comprising:
a selector circuit coupled to receive a plurality of signals having a common frequency and a different phase and to supply one of the received signals as a currently selected signal according to a select signal; and
a summing circuit coupled to add at least a first value corresponding to the select signal and a second value corresponding to a phase offset from a phase of the currently selected signal, and to generate a sum indicative thereof that corresponds to a next value of the select signal, the lower speed signal being supplied by the selector circuit according to the select signal; and wherein the lower speed signal has a higher frequency than the common frequency.

28. The apparatus as recited in claim 27 wherein the second value is negative thereby indicating an earlier phase than the first phase.

29. The apparatus as recited in claim 27 wherein the summing circuit is further coupled to receive and sum a phase adjust indication to adjust the phase offset to a different value than that indicated by the second value.

30. The apparatus as recited in claim 27 wherein the summing circuit is comprised of a first summing circuit to sum the first and second values and a second summing circuit to sum a phase adjust indication, with a result from the first summing circuit, the phase adjust indication to adjust the phase offset to a different value than that indicated by the second value.

31. The apparatus as recited in claim 27 wherein the selector circuit is further coupled to receive an input signal that is a steady state input signal.

32. The apparatus as recited in claim 27 further comprising a duty cycle correction circuit coupled to output the lower speed signal with a desired duty cycle.

33. The apparatus as recited in claim 32 wherein the duty cycle correction circuit comprises:
a second selector circuit coupled to receive the plurality of signals and select one of the plurality of signals as a second currently selected signal, the desired duty cycle being determined by the currently selecting signal from the first selector circuit and the second currently selected signal from the second selector circuit.

34. The apparatus as recited in claim 33 wherein the duty cycle correction circuit further comprises:
a set-reset latch having a set input coupled one of the first and second selector circuits and a reset input coupled to the other of the first and second selector circuits, thereby defining the duty cycle.

35. The apparatus as recited in claim 27 wherein the phase offset from the first phase step is indicative of a number of pulses to skip, each of the pulses corresponding to one of the plurality of received signals.

36. The apparatus as recited in claim 27 further comprising a first storage location storing the first value and coupled to the selector circuit to supply the first value as the select signal to the selector circuit.

37. The apparatus as recited in 36 wherein the first storage location is coupled to be updated with the sum using a clock signal having the common frequency.

38. The apparatus as recited in claim 36 wherein the first storage location is coupled to be loaded with the sum with a clock signal having a different phase than the phase of the currently selected signal.

39. The apparatus as recited in claim 27 wherein sequential pulses output by the selector circuit are selected by different values of the select signal.

40. The apparatus as recited in claim 27 wherein sequential pulses output by the selector circuit are selected by one value of the select signal.

41. The apparatus as recited in claim 27 wherein the summing circuit is a modulo N summing circuit where N equals a number of signals with the common frequency supplied to the selector circuit.

42. The apparatus as recited in claim 27 further comprising a variable divider circuit dividing the selector output signal by a third value.

43. The apparatus as recited in claim 42 wherein the third value determines a number of signal pulses passing through the selector circuit sequentially with a same phase.

44. The apparatus as recited in claim 42 further comprising a delta sigma modulator supplying the second value as part of a divide ratio to divide the first signal.

45. The apparatus as recited in claim 44 wherein the second value corresponds to an output range of the delta sigma modulator.

46. The apparatus as recited in claim 44 wherein the divide ratio is equal to YQ+R where Y is a fixed integer, Q is the third value and R is the second value.

47. The apparatus as recited in claim 46 further comprising a divider circuit that divides the first signal by the integer Y.

48. The apparatus as recited in claim 42 further comprising:
- a delay circuit coupled to receive a signal supplied by the variable divider circuit and to supply one or more delayed signals; and
- wherein the first storage location storing the first value is updated using a selected one of the signal supplied by the variable divider circuit and the one or more delayed signals, the selection being determined, at least in part, according to whether a next signal to be output by the selector circuit, lags or leads a phase of the currently selected signal.

49. The apparatus recited in claim 36 further comprising:
- a second selector circuit coupled to receive the plurality of signals;
- a second summing circuit coupled to receive the first value and a third value corresponding to another phase offset from the phase of the currently selected signal, and to generate a second sum indicative thereof;
- a second storage location coupled to receive and store the second sum using the currently selected clock signal and to supply a second select signal to the second selector circuit;
- and wherein the first storage location is coupled to receive a clock signal selected by the second selector circuit to update the first storage location.

50. An apparatus for dividing comprising:
- means for receiving a plurality of clock signals having a common frequency and a different phase and for selecting one of the clock signals, having a first phase, as a current output signal;
- means for summing a first value corresponding to the first phase, with a second value corresponding to a phase offset from the first phase, and generating a sum indicative thereof;
- means for utilizing the sum to select a second one of the clock signals having a second phase as a next output signal; and
- means for delaying outputting the next output signal to skip one or more unwanted pulses otherwise present in the next output signal.

51. An apparatus for dividing an input signal to generate a lower speed signal comprising:
- means for receiving a plurality of clock signals, derived from the input signal, having a common frequency and different respective phases and for selecting one of the clock signals, having a first phase, as a current output signal to form a first portion of the lower speed signal;
- means for summing a first value corresponding to the first phase, with a second value corresponding to a phase offset from the first phase, and generating a sum indicative thereof;
- means for utilizing the sum to select a second one of the clock signals having a second phase as a next output signal to form a second portion of the lower speed signal; and
- wherein the lower speed signal has a higher frequency than the common frequency.

* * * * *